(12) United States Patent
de Rochemont

(10) Patent No.: US 8,552,708 B2
(45) Date of Patent: Oct. 8, 2013

(54) MONOLITHIC DC/DC POWER MANAGEMENT MODULE WITH SURFACE FET

(76) Inventor: L. Pierre de Rochemont, Austin, TX (US)

( * ) Notice: Subject to any disclaimer, the term of this patent is extended or adjusted under 35 U.S.C. 154(b) by 316 days.

(21) Appl. No.: 13/152,222

(22) Filed: Jun. 2, 2011

(65) Prior Publication Data

US 2012/0098509 A1    Apr. 26, 2012

Related U.S. Application Data

(60) Provisional application No. 61/350,835, filed on Jun. 2, 2010.

(51) Int. Cl.
| | |
|---|---|
| H02M 3/02 | (2006.01) |
| H01L 21/06 | (2006.01) |
| H01L 27/32 | (2006.01) |
| H01F 17/06 | (2006.01) |
| H01F 27/24 | (2006.01) |
| H01F 27/40 | (2006.01) |

(52) U.S. Cl.
    USPC ........... 323/355; 257/531; 336/105; 336/219; 336/229

(58) Field of Classification Search
    USPC ............ 323/355; 257/531; 336/105, 219, 229
    See application file for complete search history.

(56) References Cited

U.S. PATENT DOCUMENTS

| | | |
|---|---|---|
| 2,283,925 A | 5/1942 | Harvey |
| 2,886,529 A | 5/1959 | Louis |
| 3,574,114 A | 4/1971 | Monforte |
| 3,614,554 A | 10/1971 | Shield et al. |
| 3,983,077 A | 9/1976 | Fuller et al. |
| 4,400,683 A | 8/1983 | Eda et al. |
| 4,455,545 A | 6/1984 | Shelly |
| 4,523,170 A | 6/1985 | Huth, III |
| 4,646,038 A | 2/1987 | Wanat |
| 4,759,120 A | 7/1988 | Bernstein |
| 4,777,465 A * | 10/1988 | Meinel ............................ 336/65 |
| 4,859,492 A | 8/1989 | Rogers, Jr. et al. |
| 4,880,770 A | 11/1989 | Mir et al. |
| 4,967,201 A | 10/1990 | Rich, III |
| 5,084,749 A | 1/1992 | Losee et al. |
| 5,130,675 A | 7/1992 | Sugawara |

(Continued)

FOREIGN PATENT DOCUMENTS

| | | |
|---|---|---|
| EP | 0026056 A1 | 4/1981 |
| EP | 0939451 A1 | 1/1999 |
| EP | 1376759 A2 | 2/2004 |
| GB | 1125897 A | 9/1968 |

OTHER PUBLICATIONS

International Search Report and Written Opinion dated Apr. 9, 2012 for PCT/US11/61304.

(Continued)

*Primary Examiner* — Evan Pert
(74) *Attorney, Agent, or Firm* — Burns & Levinson LLP; Jacob N Erlich; David W Gomes

(57) ABSTRACT

A monolithic DC to DC converter, provides a semiconductor substrate, a surface FET formed on the semiconductor substrate that modulates currents across a surface of the semiconductor substrate, and a toroidal inductor with a magnetic core formed on the substrate around the FET and having a first winding connected to the FET.

20 Claims, 17 Drawing Sheets

(56) References Cited

U.S. PATENT DOCUMENTS

| | | |
|---|---|---|
| 5,139,999 A | 8/1992 | Gordon et al. |
| 5,154,973 A | 10/1992 | Imagawa et al. |
| 5,198,824 A | 3/1993 | Poradish |
| 5,217,754 A | 6/1993 | Santiago-Aviles et al. |
| 5,219,377 A | 6/1993 | Poradish |
| 5,263,198 A | 11/1993 | Geddes et al. |
| 5,272,485 A | 12/1993 | Mason et al. |
| 5,403,797 A | 4/1995 | Ohtani et al. |
| 5,427,988 A | 6/1995 | Sengupta et al. |
| 5,456,945 A | 10/1995 | McMillan et al. |
| 5,478,610 A | 12/1995 | Desu et al. |
| 5,513,382 A | 4/1996 | Agahi-Kesheh et al. |
| 5,535,445 A | 7/1996 | Gunton |
| 5,540,772 A | 7/1996 | McMillan et al. |
| 5,543,773 A | 8/1996 | Evans et al. |
| 5,584,053 A | 12/1996 | Kommrusch et al. |
| 5,590,387 A | 12/1996 | Schmidt et al. |
| 5,614,252 A | 3/1997 | McMillan et al. |
| 5,621,636 A | 4/1997 | Tanigawa et al. |
| 5,625,365 A | 4/1997 | Tom et al. |
| 5,635,433 A | 6/1997 | Sengupta |
| 5,707,459 A | 1/1998 | Itoyama et al. |
| 5,707,715 A | 1/1998 | deRochemont et al. |
| 5,747,870 A | 5/1998 | Pedder |
| 5,759,923 A | 6/1998 | McMillan et al. |
| 5,764,189 A | 6/1998 | Lohninger |
| 5,771,567 A | 6/1998 | Pierce et al. |
| 5,854,608 A | 12/1998 | Leisten |
| 5,859,621 A | 1/1999 | Leisten |
| 5,888,583 A | 3/1999 | McMillan et al. |
| 5,889,459 A | 3/1999 | Hattori et al. |
| 5,892,489 A | 4/1999 | Kanba et al. |
| 5,903,421 A | 5/1999 | Furutani et al. |
| 5,933,121 A | 8/1999 | Rainhart et al. |
| 5,945,963 A | 8/1999 | Leisten |
| 6,023,251 A | 2/2000 | Koo et al. |
| 6,027,826 A | 2/2000 | deRochemont |
| 6,028,568 A | 2/2000 | Asakura et al. |
| 6,031,445 A | 2/2000 | Marty et al. |
| 6,040,805 A | 3/2000 | Huynh et al. |
| 6,046,707 A | 4/2000 | Gaughan et al. |
| 6,052,040 A | 4/2000 | Hino |
| 6,111,544 A | 8/2000 | Dakeya et al. |
| 6,143,432 A | 11/2000 | deRochemont et al. |
| 6,154,176 A | 11/2000 | Fathy et al. |
| 6,176,004 B1 | 1/2001 | Rainhart et al. |
| 6,181,231 B1 * | 1/2001 | Bartilson ............... 336/200 |
| 6,181,297 B1 | 1/2001 | Leisten |
| 6,188,368 B1 | 2/2001 | Koriyama et al. |
| 6,195,049 B1 | 2/2001 | Kim et al. |
| 6,204,203 B1 | 3/2001 | Narwankar et al. |
| 6,208,843 B1 | 3/2001 | Huang et al. |
| 6,222,489 B1 | 4/2001 | Tsuru et al. |
| 6,266,020 B1 | 7/2001 | Chang |
| 6,271,803 B1 | 8/2001 | Watanabe et al. |
| 6,300,894 B1 | 10/2001 | Lynch et al. |
| 6,320,547 B1 | 11/2001 | Fathy et al. |
| 6,323,549 B1 | 11/2001 | deRochemont et al. |
| 6,492,949 B1 | 12/2002 | Breglia et al. |
| 6,495,019 B1 * | 12/2002 | Filas et al. ............... 205/119 |
| 6,496,149 B1 | 12/2002 | Birnbaum et al. |
| 6,501,415 B1 | 12/2002 | Viana et al. |
| 6,541,820 B1 | 4/2003 | Bol |
| 6,552,693 B1 | 4/2003 | Leisten |
| 6,559,735 B1 | 5/2003 | Hoang et al. |
| 6,583,699 B2 | 6/2003 | Yokoyama |
| 6,605,151 B1 | 8/2003 | Wessels et al. |
| 6,611,419 B1 | 8/2003 | Chakravorty |
| 6,620,750 B2 | 9/2003 | Kim et al. |
| 6,639,556 B2 | 10/2003 | Baba |
| 6,642,908 B2 | 11/2003 | Pleva et al. |
| 6,650,303 B2 | 11/2003 | Yoon et al. |
| 6,670,497 B2 | 12/2003 | Tashino et al. |
| 6,680,700 B2 | 1/2004 | Hilgers |
| 6,683,576 B2 | 1/2004 | Achim |
| 6,686,406 B2 | 2/2004 | Tomomatsu et al. |
| 6,690,336 B1 | 2/2004 | Leisten et al. |
| 6,697,605 B1 | 2/2004 | Atokawa et al. |
| 6,742,249 B2 | 6/2004 | deRochemont et al. |
| 6,743,744 B1 | 6/2004 | Kim et al. |
| 6,762,237 B2 | 7/2004 | Glatkowski et al. |
| 6,791,496 B1 | 9/2004 | Killen et al. |
| 6,864,848 B2 | 3/2005 | Sievenpiper |
| 6,906,674 B2 | 6/2005 | McKinzie, III et al. |
| 6,919,119 B2 | 7/2005 | Kalkan et al. |
| 7,012,414 B1 * | 3/2006 | Mehrotra et al. ............. 323/306 |
| 7,047,637 B2 | 5/2006 | deRochemont et al. |
| 7,405,698 B2 | 7/2008 | deRochemont |
| 7,564,887 B2 | 7/2009 | Wang et al. |
| 7,763,917 B2 | 7/2010 | deRochemont |
| 2001/0023779 A1 | 9/2001 | Sugaya et al. |
| 2001/0027119 A1 | 10/2001 | Furutani et al. |
| 2001/0048969 A1 | 12/2001 | Constantino et al. |
| 2002/0039667 A1 | 4/2002 | Takaya et al. |
| 2002/0047768 A1 | 4/2002 | Duffy |
| 2002/0070983 A1 | 6/2002 | Kozub et al. |
| 2002/0092472 A1 | 7/2002 | Hayashi et al. |
| 2002/0110004 A1 | 8/2002 | Parks |
| 2002/0190818 A1 | 12/2002 | Endou et al. |
| 2003/0002045 A1 | 1/2003 | Nemat-Nasser et al. |
| 2003/0034124 A1 | 2/2003 | Sugaya et al. |
| 2003/0073565 A1 | 4/2003 | Ellis et al. |
| 2003/0080325 A1 | 5/2003 | Uchiyama et al. |
| 2003/0107455 A1 | 6/2003 | Imanaka et al. |
| 2003/0111714 A1 | 6/2003 | Bates et al. |
| 2003/0122647 A1 | 7/2003 | Ou |
| 2003/0148024 A1 | 8/2003 | Kodas et al. |
| 2003/0161959 A1 | 8/2003 | Kodas et al. |
| 2003/0170436 A1 | 9/2003 | Sumi et al. |
| 2003/0221621 A1 | 12/2003 | Pokharna et al. |
| 2004/0000964 A1 | 1/2004 | Killen et al. |
| 2004/0000966 A1 | 1/2004 | Killen et al. |
| 2004/0000970 A1 | 1/2004 | Killen et al. |
| 2004/0000972 A1 | 1/2004 | Killen et al. |
| 2004/0000975 A1 | 1/2004 | Killen et al. |
| 2004/0000976 A1 | 1/2004 | Killen et al. |
| 2004/0001024 A1 | 1/2004 | Killen et al. |
| 2004/0001026 A1 | 1/2004 | Killen et al. |
| 2004/0001027 A1 | 1/2004 | Killen et al. |
| 2004/0001028 A1 | 1/2004 | Killen et al. |
| 2004/0012081 A1 | 1/2004 | Kwon |
| 2004/0033654 A1 | 2/2004 | Yamagata |
| 2004/0070915 A1 | 4/2004 | Nagai et al. |
| 2004/0084080 A1 | 5/2004 | Sager et al. |
| 2004/0092236 A1 | 5/2004 | Irie et al. |
| 2004/0113738 A1 | 6/2004 | Ahn et al. |
| 2004/0118448 A1 | 6/2004 | Scher et al. |
| 2004/0189528 A1 | 9/2004 | Killen et al. |
| 2005/0036269 A1 | 2/2005 | Ma et al. |
| 2005/0051870 A1 | 3/2005 | Yamazaki et al. |
| 2005/0068792 A1 | 3/2005 | Yasumura |
| 2006/0086994 A1 | 4/2006 | Viefers et al. |
| 2006/0092079 A1 | 5/2006 | deRochemont |
| 2006/0125681 A1 | 6/2006 | Smith et al. |
| 2006/0134491 A1 | 6/2006 | Hilchenko et al. |
| 2006/0227576 A1 | 10/2006 | Yasumura |
| 2007/0003781 A1 | 1/2007 | deRochemont |
| 2007/0137257 A1 | 6/2007 | DeSantolo et al. |
| 2007/0139976 A1 | 6/2007 | deRochemont |
| 2007/0166453 A1 | 7/2007 | Van Duren et al. |
| 2007/0170535 A1 | 7/2007 | deRochemont |
| 2007/0259768 A1 | 11/2007 | Kear et al. |
| 2008/0136395 A1 | 6/2008 | Bennett |
| 2009/0004370 A1 | 1/2009 | Zurcher et al. |
| 2009/0011922 A1 | 1/2009 | deRochemont |
| 2009/0015314 A1 | 1/2009 | Kirchmeier et al. |
| 2010/0328010 A1 | 12/2010 | Noma et al. |
| 2011/0021007 A1 | 1/2011 | deRochemont et al. |
| 2011/0049394 A1 | 3/2011 | deRochemont |
| 2011/0065224 A1 | 3/2011 | Bollman et al. |
| 2011/0169102 A1 | 7/2011 | Uno et al. |
| 2011/0248900 A1 | 10/2011 | deRochemont |

(56) References Cited

OTHER PUBLICATIONS

Andrenko, A.S. et al. EM Analysis of PBG Substrate Microstrip Circuits for Integrated Transmitter Front End. MMET 2000 Proceedings pp. 295-297.

Bardi, I. et al. Plane Wave Scattering From Frequency-Selective Surfaces by the Finite-Element Method. IEEE Transactions on Magnetics 38(2) Mar. 2002. pp. 641-644.

Chappell, W. et al. Composite Metamaterial Systems for Two-Dimensional Periodic Structures. © 2002 IEEE pp. 384-387.

Cheng, Y.L. et al. Preparation and Characterization of (Ba.Sr)TiO3 thin films using interdigital electrodes. Microelectronic Engineering vol. 66 (2003) 872-879.

Clavijo, S. et al. Design Methodology for Sievenpiper High-Impedance Surfaces: An Artificial Magnetic Conductor for Positive Gain Electrically Small Antennas. IEEE Transactions on Antennas and Propagation 51(10). Oct. 2003. pp. 2678-2690.

Diaz, R. et al. Magnetic Loading of Artificial Magnetic Conductors for Bandwidth Enhancement. © 2003 IEEE pp. 431-434.

Hansen, R.C. Effects of a High-Impedance Screen on a Dipole Antenna. IEEE Antennas and Wireless Propagation Letters vol. 1 2002 pp. 46-49.

Joshi, P.C. et al. Processing and Characterization of Pure and Doped Ba0.6Sr 0.4TiO3 thin films for tunable microwave applications. Mat. Res. Soc. Symp. Proc. vol. 656E (2001) DD4.9.1-DD4.9.6.

Kern, D.J. et al. Active Negative Impedance Loaded EBG Structures for the Realization of Ultra-Wideband Artificial Magnetic Conductors. © 2003 IEEE pp. 427-430.

Kern, D.J. et al. The Synthesis of Metamaterial Ferrites for RF Applications Using Electromagnetic Bandgap Structures. © 2003 IEEE pp. 497-500.

Kern, D.J. et al. Ultra-thin Electromagnetic Bandgap Absorbers Synthesized via Genetic Algorithms. © 2003 IEEE pp. 1119-1122.

Khun, R. et al., Characterization of Novel Mono- and Bifacially Active Semi-Transparent Crystalline Silicon Solar Cells, IEEE Transactions on Electron Devices, 46(10), Oct. 1999, p. 2013-2017.

Kretly, L.C. et al. The Influence of the Height Variation on the Frequency Bandgap in an AMC Artificial Magnetic Conductor for Wireless Applications: an EM Experimental Design Approach. Proceedings SBMO/IEEE MTT-S IMOC 2003 pp. 219-223.

Lee, Y. et al. Investigation of Electromagnetic Bandgap (EBG) Structures for Antenna Pattern Control. © 2003 IEEE, pp. 1115-1118.

McKinzie III, W.E. et al. Mitigation of Multipath Through the Use of an Artificial Magnetic Conductor for Precision CPS Surveying Antennas. © 2002 IEEE pp. 640-643.

McKinzie, W. et al. A Multi-Band Artificial Magnetic Conductor Comprised of Multiple FSS Layers. © 2003 IEEE pp. 423-426.

Monorchio, A. et al. Synthesis of Artificial Magnetic Conductors by Using Multilayered Frequency Selective Surfaces. IEEE Antennas and Wireless Propagation Letters vol. 1 2002 pp. 196-199.

Mosallaei, H. et al. Periodic Bandgap and Effective Dielectric Materials in Electromagnetics: Characterization and Applications in Nanocavities and Waveguides. IEEE Transactions on Antennas and Propagation 51(3). Mar. 2003. pp. 549-563.

Pontes, F.M. et al. Study of the dielectric and ferroelectric properties of chemically processed BaxSr1-xTiO3 thin films. Thin Solid Films, vol. 386, No. 1 (2001) 91-98.

Rogers, S. et al. AMCs Comprised of Interdigital Capacitor FSS Layers Enable Lower Cost Applications. © 2003 IEEE pp. 411-414.

Rogers, S. et al. An AMC-Based 802.11a/b Antenna for Laptop Computers. © 2003 IEEE pp. 10-13.

Sievenpiper, D.F. et al. Two-Dimensional Beam Steering Using an Electrically Tunable Impedance Surface. IEEE Transactions on Antennas and Propagation 51(10). Oct. 2003. pp. 2713-2722.

Sun, J. et al. Efficiency of Various Photonic Bandgap (PBG) Structures. $3^{rd}$ Int'l. Conf. on Microwave and Millimeter Wave Technology Proceedings 2002. pp. 1055-1058.

Tsunemine, Y. et al. Pt/BaxSr(1-x)TiO3/Pt Capacitor Technology for 0.15 micron Embedded Dynamic Random Access Memory. Jap. J. Appl. Phys. vol. 43 No. 5A (2004) 2457-2461.

Vest, R.W. Metallo-organic decomposition (MOD) processing of ferroelectric and electro-optic films: A review. Ferroelectrics, 102:1, 53-68.

Viviani, M. et al. Positive Temperature Coefficient of Electrical Resistivity below 150k of Barium Strontium Titanate. J. Amer. Ceram. Soc. vol. 87 (2004) 756-758.

Weily, A.R. et al. Antennas Based on 2-D and 3-D Electromagnetic Bandgap Materials. © 2003 IEEE pp. 847-850.

Yang, H-Y. D. et al. Surface Waves of Printed Antennas on Planar Artificial Periodic Dielectric Structures. IEEE Transactions on Antennas and Propagation 49(3). Mar. 2001. pp. 444-450.

Zhang, Y. et al. Planar Artificial Magnetic Conductors and Patch Antennas. IEEE Transactions on Antennas and Propagation 51(10). Oct. 2003. pp. 2704-2712.

Ziroff, A. et al. A Novel Approach for LTCC Packaging Using a PBG Structure for Shielding and Package Mode Suppression. $33^{rd}$ European Microwave Conference—Munich 2003 pp. 419-422.

\* cited by examiner

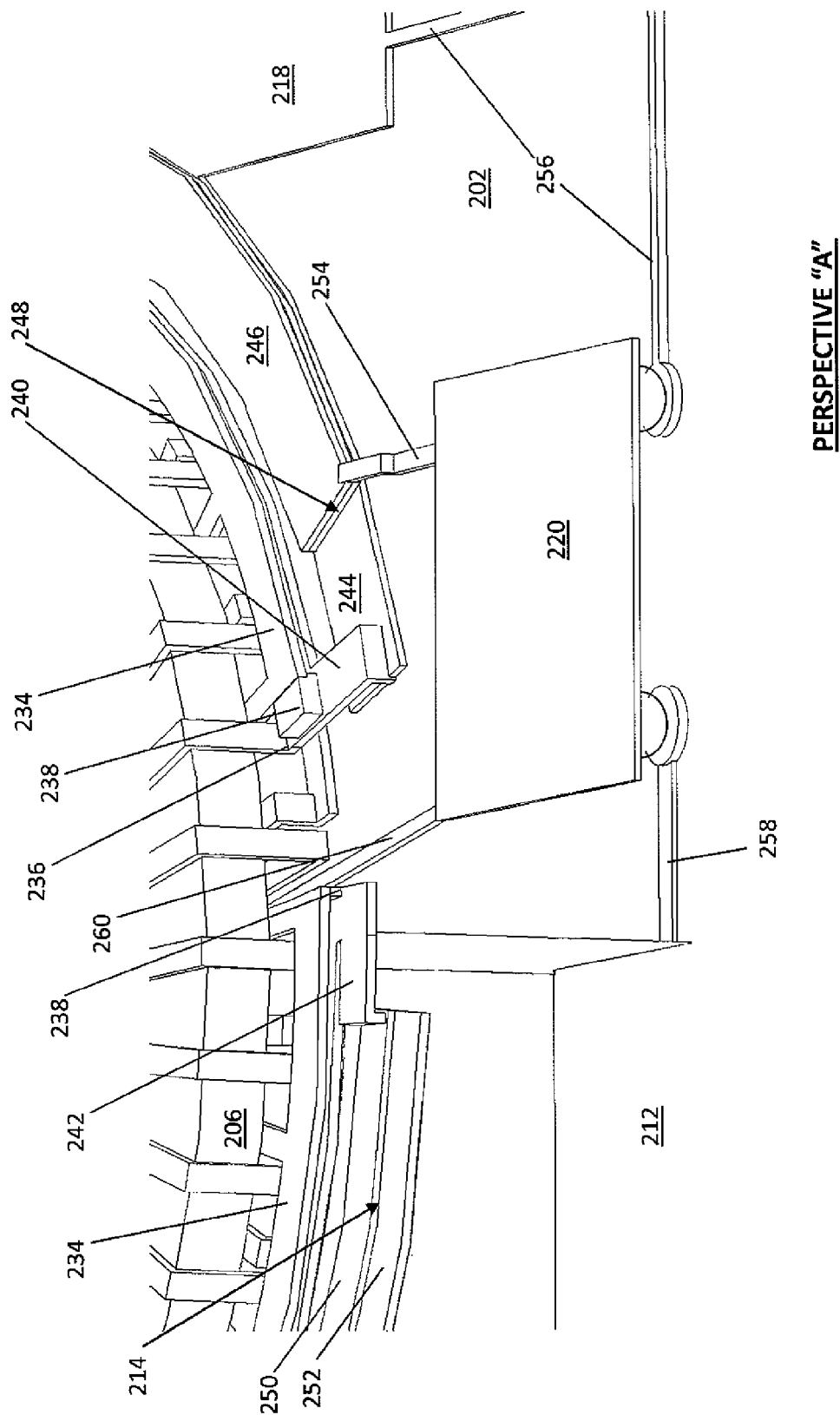

TOP PERSPECTIVE CLOSE UP

MONOLITHIC DC/DC POWER MANAGEMENT MODULE WITH SURFACE FET

CROSS REFERENCE TO RELATED APPLICATIONS

This application claims priority from U.S. Provisional Patent Application Ser. No. 60/350,835, filed Jun. 2, 2010 and incorporated herein by reference in its entirety.

STATEMENT OF GOVERNMENT INTEREST

This invention was made and funded by the U.S. Government, specifically by the U.S. Marine Corps Systems Command under Contract M67854-09-6537. The U.S. Government has certain rights in the invention.

FIELD OF THE INVENTION

The present invention generally relates to DC/DC power management devices configured as a fully integrated system on a semiconductor chip, and in particular to such devices that modulate the drawn power with a planar MOSFET switch and diode embedded in the semiconductor upon which the device is integrated.

BACKGROUND OF THE INVENTION

DC/DC power management systems generally regulate DC power supplied from a battery at a particular voltage/current by conditioning the output voltage and current to levels that are appropriate for a particular circuit. It is also desirable to extend the battery life of mobile platforms by using the power management device to selectively turning off a given circuit during time intervals when its functions are not absolutely needed by the larger system it serves. Since most mobile electronic systems will comprise a plurality of circuits that each operate at a variety of voltage and current levels different from those supplied by the battery, a plurality of DC/DC power management systems are required to assure each distinct circuit is operating with well conditioned power. The overall system's power efficiency is optimized and costs are minimized by using low loss DC/DC power management modules that are fully integrated at the semiconductor wafer scale.

Depending upon the power levels required, DC/DC power management systems may be configured in various control topologies: buck, boost, buck-boost, Luo (positive and negative type), Ca, transformer-type (forward, fly-back, zeta), and super-lift (positive, negative, positive push-pull, negative push-pull, double/enhanced circuit), among others. Common features to all these systems include: one or more passive components (resistor or capacitor), at least one power switch, at least one diode, and either at least one inductor coil, transformer coil, or both. (See FIG. 1). As explained below, the discrete assembly of these individual components is an obstacle to increasing power density, reducing form factor (size), lowering cost, improving reliability, and improving power efficiency. It is therefore the principal aim of the present invention to improve these system parameters by eliminating any and all discretely assembled components from the fabrication process. It is herein understood that this invention applies to all DC/DC power management systems, irrespective of the control topology or circuit application.

Electrical loss and electromagnetic interference ("EMI") are the leading obstacles to achieving high efficiency, low form factor, high-speed power management systems. Inductor/transformer coils are usually the largest component of the DC/DC converter systems and the principal cause of electrical loss and EMI. Technologies that have the potential to drive power management circuits at higher switching speeds will reduce the inductor/transformer coil's required inductance and, therefore, lower the coil's size. Large EMI is undesirable because it can destabilize circuit settling times. EMI is largely a property of specific coil designs that do not form a closed path for their magnetic current. EMI is also generated by magnetic flux creep and proximity losses, which are also intrinsic qualities of the coil's design.

Often, high permeability magnetic core materials are used to reduce coil size. Although ceramics have lower permeability than magnetic metal permalloys, ceramic cores are preferred because they provide higher electrical resistance. The higher resistance allows the coil and the converter circuit to be driven at higher switching speeds, since it minimizes eddy current losses within the magnetic core. Eddy current loss is quantified as:

$$P_{Loss} = I_{eddy}^2 \cdot R_E \quad (1)$$

A higher loss adds an additional system constraint, as the lost power is converted into heat, which must be managed to maintain stable performance of the modulating power switch. Magnetic component core loss is the primary obstacle to achieving acceptable transformer efficiencies ($\geq 90\%$) in high speed, high power switched mode power supplies ("SMPS"), because they increase as the square of the operating frequency. A 10-fold increase in the switching frequency results in 100-fold increase in eddy current power loss.

Eddy current loss in the magnetic core also imposes a practical limit on switching speed and circuit form factor. As a result, transformer coils are often designed to handle smaller magnetic flux swings (lower power) at higher frequencies to avoid excessive loss. For the reasons cited above, magnetic core losses in commercial ferrite ceramics currently limit power management module switching frequencies to values between 5-10 MHz.

Eddy current losses also impose limits on overall power thresholds because they will vary as the square of the pulsed voltage amplitude, $V_p$, in which case the loss is given as:

$$\text{Eddy current loss} = \frac{V_p^2}{R_E} \cdot \frac{t_p}{T} \quad (2)$$

Where $R_E$, is the ac resistance experienced by eddy currents circulating in the magnetic core, and $t_p$ is the width of the pulse that keeps the switch in its "on" or "closed" mode, and T is the time period of the switch duty cycle. Since higher switching speeds enable the use of circuit components with smaller inductance values and further power management module miniaturization, it is therefore desirable to minimize magnetic core loss to the greatest extent possible.

1. Description of the Prior Art.

Hopper et al., U.S. Pat. No. 7,652,348 B1, "APPARATUS & METHOD FOR WAFER LEVEL FABRICATION OF HIGH VALUE INDUCTORS ON SEMICONDUCTOR IC's", issued Jan. 1, 26, 2010, (Hopper et al. '348) teach the assembly of inductor coils on semiconductor wafers containing active devices buried beneath the wafer surface using high permeability magnetic core material prepared from powder pastes, but does not instruct methods enable a low-loss magnetic core that operates at switching frequencies above 10 MHz.

Ou, U.S. Ser. No. 10/236,700, "INDUCTOR FORMED ON A SILICON SUBSTRATE AND METHOD OF MANUFACTURING THE SAME", filed Sep. 5, 2002 and published Jul. 3, 2003 as 20030122647 teaches the integration of inductor coils using methods that are compatible with CMOS semiconductor processes, but does not disclose means to introduce high-permeability magnetic core material to miniaturize the formed inductor coil.

Ewing et al., U.S. Ser. No. 12/344,419, "POWER DISTRIBUTION, MANAGEMENT, AND MONITORING SYSTEMS AND METHODS", filed Dec. 26, 2008, and published Sep. 17, 2009 as 20090234512 discloses the discrete assembly of power management system that contain toroidal inductor coils.

Evans et al., U.S. Pat. No. 5,543,773. "TRANSFORMERS AND COUPLED INDUCTORS WITH OPTIMUM INTERLEAVING", issued Aug. 6, 1996, discloses the discrete assembly of toroidal inductor and transformer coils on a printed circuit board with optimal interleaving to minimize flux leakage and proximity losses as shown in FIG. 2.

2. Definition of Terms

The term "active component" is herein understood to refer to its conventional definition as an element of an electrical circuit that that does require electrical power to operate and is capable of producing power gain.

The term "amorphous material" is herein understood to mean a material that does not comprise a periodic lattice of atomic elements, or lacks mid-range (over distances of 10's of nanometers) to long-range crystalline order (over distances of 100's of nanometers).

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The terms "discrete assembly" or "discretely assembled" is herein understood to mean the serial construction of an embodiment through the assembly of a plurality of pre-fabricated components that individually comprise a discrete element of the final assembly.

The term "emf" is herein understood to mean its conventional definition as being an electromotive force.

The term "integrated circuit" is herein understood to mean a semiconductor chip into which at least one transistor element has been embedded.

The term "LCD" is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The term "liquid precursor solution" is herein understood to mean a solution of hydrocarbon molecules that also contains soluble metalorganic compounds that may or may not be organic acid salts of the hydrocarbon molecules into which they are dissolved.

The term "microstructure" is herein understood to define the elemental composition and physical size of crystalline grains forming a material substance.

The term "MISFET" is herein understood to mean its conventional definition by referencing a metal-insulator-semiconductor field effect transistor.

The term "mismatched materials" is herein understood to define two materials that have dissimilar crystalline lattice structure, or lattice constants that differ by 5% or more, and/or thermal coefficients of expansion that differ by 10% or more.

The term "MOSFET" is herein understood to mean its conventional definition by referencing a metal-oxide-silicon field effect transistor.

The term "nanoscale" is herein understood to define physical dimensions measured in lengths ranging from 1 nanometer (nm) to 100's of nanometers (nm).

The term "passive component" is herein understood to refer to its conventional definition as an element of an electrical circuit that that does not require electrical power to operate and is not capable of producing power gain.

The term "standard operating temperatures" is herein understood to mean the range of temperatures between $-40°$ C. and $+125°$ C.

The terms "tight tolerance" or "critical tolerance" are herein understood to mean a performance value, such as a capacitance, inductance, or resistance, that varies less than $\pm 1\%$ over standard operating temperatures.

In view of the above discussion, it would be beneficial to have higher efficiency, higher reliability, lower form factor, lower cost DC/DC power management devices that are enabled by integrating all the devices' electrical components as materials formed at the wafer scale on the surface of a semiconductor chip.

SUMMARY OF THE INVENTION

In one embodiment, the present invention provides a monolithic DC to DC converter, comprising: a semiconductor substrate; a surface FET formed on the semiconductor substrate that modulates currents across a surface of the semiconductor substrate; and a toroidal inductor with a magnetic core formed on the substrate around the FET and having a first winding connected to the FET.

The first winding may be a primary inductor coil and the converter may comprise a secondary inductor coil formed on the substrate and having windings interleaved between windings of the primary inductor coil.

The FET may include a circular or arcuate source electrode and an arcuate gate electrode formed peripherally around the source electrode. The converter may further comprise a via connecting the source electrode through the substrate to a ground plane. The FET may include an arcuate drain electrode formed peripherally to the source and gate electrodes. The FET may include a plurality of arcuate drain electrodes formed peripherally at different angular positions around the source and gate electrodes. The FET may include passive components formed on the semiconductor substrate within the toroidal inductor and connected to the source, gate or drain electrodes.

The converter may further comprise an arcuate plate capacitor formed peripherally to the toroidal inductor. The converter may further comprise an arcuate diode formed peripherally to the toroidal inductor.

The magnetic core may be ceramic and formed on the substrate with at least one layer of amorphous silica located between opposing sections of high permeability crystalline core material. The toroidal inductor may include a secondary winding having a turn aligned with the at least one layer of amorphous silica.

The toroidal inductor may include windings that are mechanically constrained. The mechanic constraint of the windings may be achieved by a coating of amorphous silica.

The monolithic DC to DC converter may have a semiconductor substrate containing silicon. The monolithic DC to DC converter may have III-V compound semiconductor substrate.

Another embodiment of the present invention provides a magnetic core, comprising a ceramic core element formed with at least one layer of amorphous silica located between opposing sections of high permeability crystalline core material, wherein the ceramic element (or core material) has a resistivity >$10^4$ ohm-cm and a permeability ≥70. The ceramic element (or core material) may have a resistivity >$10^{12}$ ohm-cm and a permeability ≥200. The ceramic core element may be formed with a plurality of amorphous silica layers, each located between opposing sections of crystalline core material. The magnetic core may further comprise an electrical conductor winding aligned with the at least one layer of amorphous silica.

Yet another embodiment of the present invention provides an inductor, comprising: a magnetic core formed with a dielectric gap of high-resistivity material located between opposing sections of crystalline core material and an electrical conductor aligned with the dielectric gap. The dielectric gap may be amorphous silica. The electrical conductor may be a secondary winding of a transformer.

BRIEF DESCRIPTION OF THE DRAWINGS

The present invention is illustratively shown and described in reference to the accompanying drawings, in which:

FIG. 8C, 8D, 8F show limited perspective views of a portion of the device of FIG. 7.

DETAILED DESCRIPTION OF THE INVENTION

The present invention is introduced using examples and particular embodiments for descriptive purposes. Although a variety of examples are presented to show how various configurations can be employed to achieve the desired improvements, these particular embodiments are only illustrative and not intended in any way to restrict the inventions presented.

This application incorporates by reference all matter contained in de Rochemont, U.S. Ser. No. 11/479,159, filed Jun. 30, 2006, entitled "ELECTRICAL COMPONENT AND METHOD OF MANUFACTURE" (the '159 application), de Rochemont, U.S. Ser. No. 11/620,042 filed Jan. 6, 2007 entitled "POWER MANAGEMENT MODULES" (the '042 application, de Rochemont and Kovacs, U.S. Ser. No. 12/843,112 filed Jul. 26, 2010, "LIQUID CHEMICAL DEPOSITION PROCESS APPARATUS AND EMBODIMENTS", (the '112 application), and de Rochemont and Farmer, U.S. Pat. No. 5,707,715, entitled "METAL CERAMIC COMPOSITES WITH IMPROVED INTERFACIAL PROPERTIES AND METHODS TO MAKE SUCH COMPOSITES", issued Jan. 13, 1998.

Figure 1:
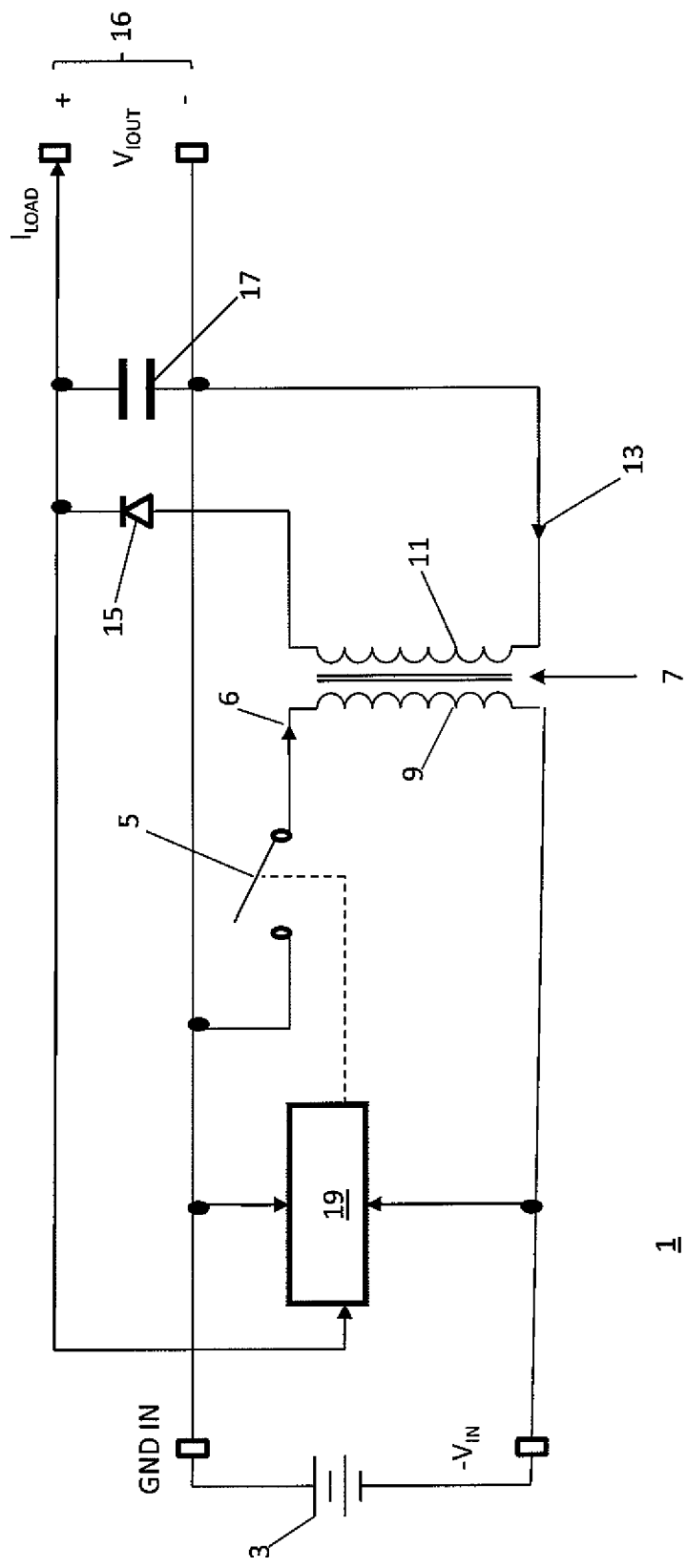
FIG. 1 is a representative circuit schematic for a DC-DC converter in fly-back configuration.
Figure 2:
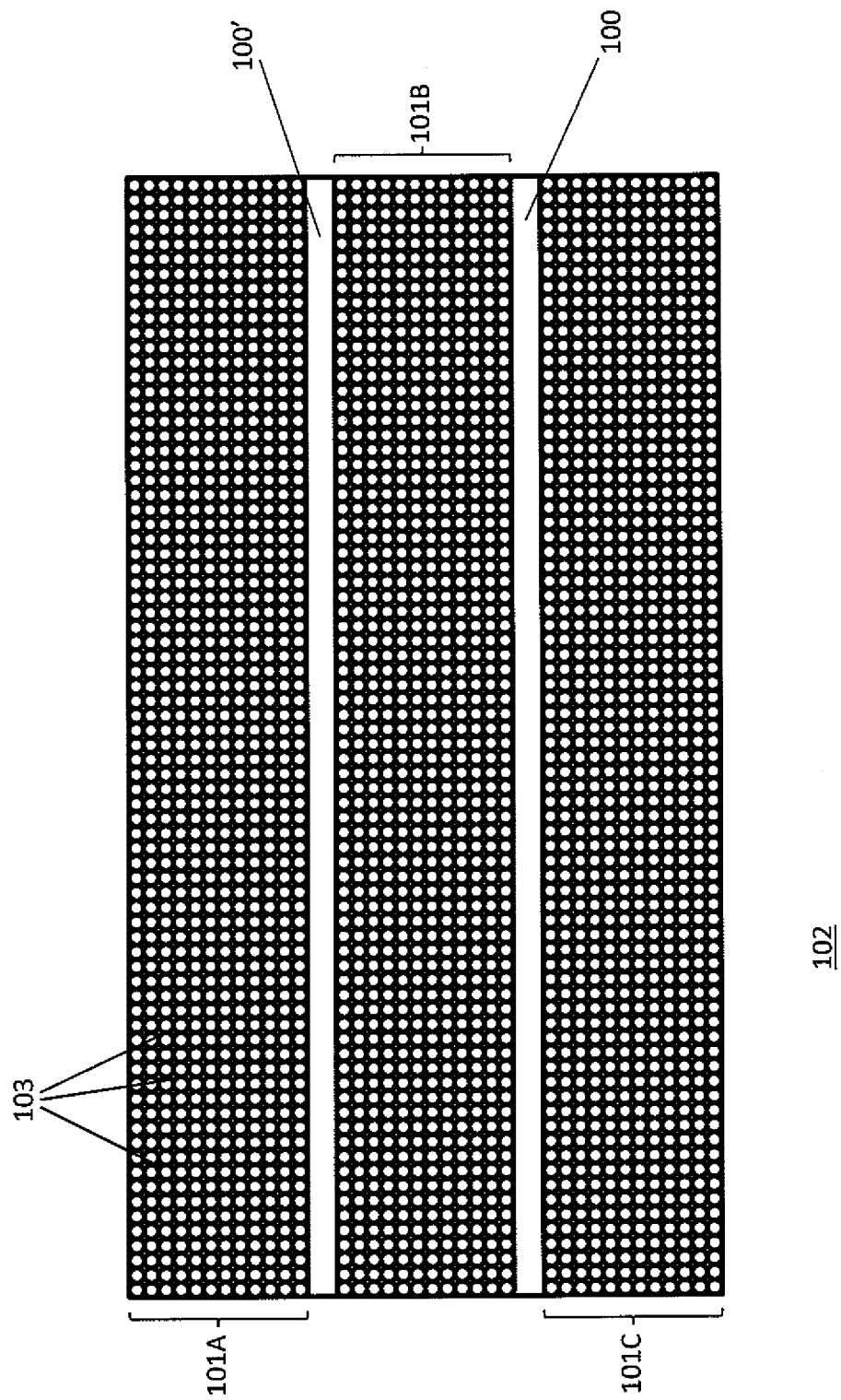
FIG. 2 is a low loss magnetic ceramic core in accordance with one embodiment of the present invention.

Reference is now made to FIGS. 1-4 to help illustrate relevant aspects of this invention. FIG. 1 provides a circuit schematic of a DC/DC power management circuit using fly-back configuration. A power management system 1 is generally, but not necessarily, comprised of a DC power source 3 that feeds at least one power switch 5, which modulates the primary current 6 drawn from electrical ground to at least one transformer 7 comprised of a primary inductor coil 9 and a secondary inductor coil 11. Certain topologies may use an inductor coil 9,11 in series or parallel connection as opposed to a transformer 7. In the fly-back configuration, the output of the primary coil current 6 induces a back emf in the secondary coil that draws secondary current 13. The secondary coil 11 output current flows through a diode 15, which supplies the circuit's conditioned DC output power 16 and charges a capacitor 17 that supplies current to the secondary coil 11. A switch controller 19 monitors the differential output voltage 16, power source voltage 3, and uses those inputs to modulate the power switch 5. As noted above, different power control circuit topologies will comprise at least one switch 5, one diode 15, one capacitor 17, and one inductor coil 9,11 or transformer coil 7, and one controller circuit 19. They may additionally comprise other passive (resistor, capacitor, and inductor) or active (diode or transistor switch) components not shown in FIG. 1 that fall under the scope of the present invention.

A particular aspect of the present invention is to reduce eddy current and other losses in the magnetic core of an inductor or transformer component to drive DC/DC power management circuits at switching frequencies higher than 20 MHz, preferably frequencies higher than 500 MHz, while simultaneously managing large operating voltages, $V_p$. Loss tangent, tan $\delta_m$, in the ferrite ceramic magnetic core materials is generated by the three principal loss mechanisms: hysteresis, eddy current, and residual loss.

$$\frac{\tan \delta}{\mu_{ri}} = \underbrace{\frac{\tan \delta_h}{\mu_{ri}}}_{\text{Hysteresis}} + \underbrace{\frac{\tan \delta_e}{\mu_{ri}}}_{\text{Eddy current}} + \underbrace{\frac{\tan \delta_r}{\mu_{ri}}}_{\substack{\text{Residual} \\ \diagup \\ \text{Ferrimagnetic \& Domain Wall Resonances}}}$$

Hysteresis is the dominant loss mechanism at frequencies lower than 100 KHz and can be controlled by selecting suitable compositions and eliminating defects and impurities. Eddy current losses are managed by increasing the resistivity of the magnetic core material. Residual loss is the dominant mechanism at frequencies above 10 MHz and is pronounced when the ceramic grain size is large enough to allow two (2) or more magnetic domains to interact with one another within a single grain.

These loss mechanisms are resolved by the present invention to allow the inductor components within a control circuit to manage power levels greater than 50 W, preferably greater than 100 W and be switched at speeds in the range of 20 MHz to 500 MHz. As articulated in de Rochemont '159, de Rochemont '042, and de Rochemont and Kovacs '112, which are incorporated herein by reference, liquid chemical deposition ("LCD") provides the means to form high complexity ceramic compositions with elemental uniformity less than ±0.5 mol % on the surface of a semiconductor wafer at temperatures that do not adversely affect active components integrated just below the semiconductor surface. The LCD liquid precursor solutions are formed from low volatility metalorganic acid salts. This facilitates the maintenance of high purity levels in the finished deposits by allowing metal-based refining prior to depositing the magnetic core material on the wafer surface. This ability to formulate high purity metal oxides in high complexity ceramic compositions having atomic scale chemical uniformity eliminates the defects that contribute to hysteresis loss and would be present in powder-processed magnetic cores, whether they are integrated in the semiconductor surface or not. The ability to integrate high chemical complexity materials having atomic scale uniformity on the surface of a semiconductor enables the development of high permeability ($\mu_R \geq 70$, preferably $\mu_R \geq 200$) magnetic cores that simultaneously have high resistivity that make the circuit suitable for high frequency operation. Combined, these enable the development of power management circuits that have power densities exceeding 200 W-in$^{-3}$, and preferably 500 W-in$^{-3}$.

A particular aspect of this invention address eddy current losses. The first method utilizes LCD to add non-magnetic elements comprising magnesium oxide (MgO), zinc oxide (ZnO), and copper oxide (Cu) into the ferrite core material to increase its resistivity to levels greater than $10^3$ $\Omega$-cm, preferably to levels greater than $10^7$ $\Omega$-cm, while simultaneously holding the desired high permeability, $\mu_R$. The second method shown in FIG. 2 optionally inserts at least one thin layer of amorphous silica 100,100' between layers of high resistivity, high permeability ceramic material 101A,101B,101C within the magnetic core 102 formed on the surface of a semiconductor device. Amorphous silica is a formidable dielectric, endowed with a dielectric breakdown of 10,000 KV-cm$^{-1}$ and an electrical resistivity on the order of $10^{16}$ $\Omega$-cm, while having low dielectric constant ($\in_R$=3.85) and low dielectric loss (tan $\delta$=2×10$^{-5}$). A principal objective of the amorphous silica layer(s) 100 in combination with the high-resistivity, high permeability ceramic material 101 is to produce a magnetic core having an internal resistance greater than $10^5$ $\Omega$-cm$^{-3}$ per Watt of acceptable loss at a given switching frequency. This level of internal resistance ($\rho_{internal}$) will reduce eddy current losses within the magnetic core to levels less than 0.5 mW-cm$^{-3}$, preferably to loss levels less than or equal to 20 $\mu$W-cm$^{-3}$. These high internal resistance levels enable this aspect of the invention to be applied to managing power levels of 500 W or more.

Yet another aspect of this invention applies the LCD process to formulate high permeability magnetic material having low residual loss, which is a dominant loss mechanism above 10 MHz. This aspect of the invention utilizes LCD's ability to formulate a complex ceramic composition with uniform grain size diameter 103, wherein 100% of the grains have diameters less than 1.5× the mean grain size diameter, and said grain mean size diameter less than 5 $\mu$m, preferably less than 2 $\mu$m.

A further aspect of this invention relates to the integration of at least one inductor or transformer coil enveloped around a low-loss ($\leq$0.5 mW-cm$^{-3}$), high permeability ($\mu_R \geq 70$) magnetic core material that is fully integrated on to a semiconductor die. Fully integrated systems achieve dramatically higher field reliability and sharply lower cost. While transistor assemblies have been integrated into semiconductor die, the inability for powder-based or paste-based ceramic manufacturing to maintain performance values within "critical tolerances" has made system-on-chip passive assemblies, such as those taught by Hopper et al. '348) cost prohibitive due to the inability to rework an out-of-tolerance passive component once it is integrated into a solid state structure.

Figure 3:
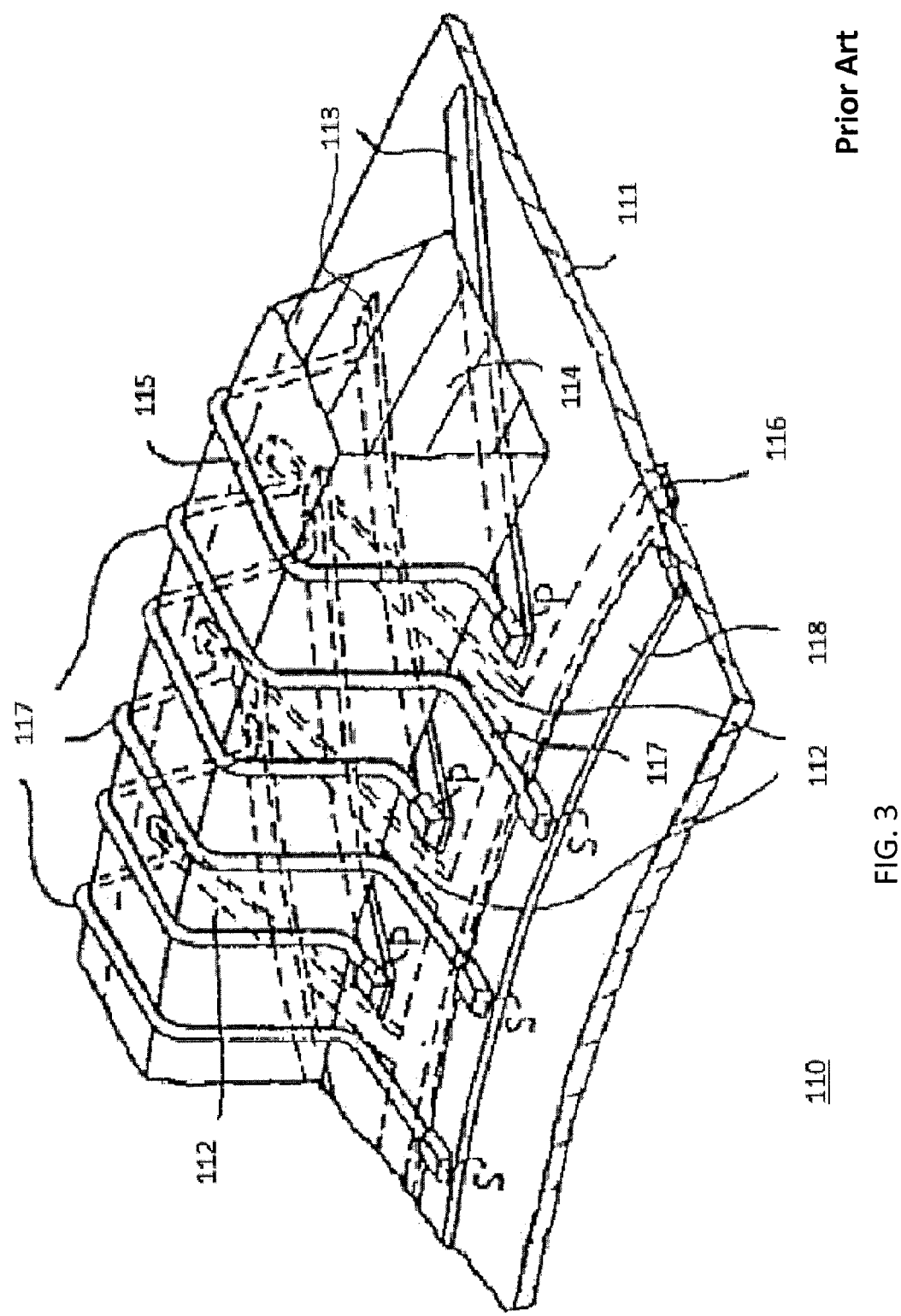
FIG. 3 is a power management device assembled from discrete component as described in the prior art.

FIG. 3 depicts a portion of a discretely assembled power management device 110 as taught in the prior art that enables an inductor coil design that is particularly useful in making low EMI transformer coils. Conductor traces are screen printed onto both sides of a prefabricated passive dielectric substrate 111. Secondary coil conductor winding traces 112 are printed on the bottom of the dielectric substrate 111, while primary coil conductor winding traces 113 are printed on the top surface of the dielectric substrate 111. A pre-fabricated toroidal magnetic core 114 is mounted to the surface of the dielectric substrate 111, either by using an adhesive (not shown) or by mechanically fixing it in place with wire bonds that wrap around the toroidal magnetic core 114 to complete the coil windings. One set of wire bonds 115 are used to electrically connect the primary coil (P) having turns configured in series. A conductive ring 116, to which the secondary coil winding traces 112 are electrically connected, is formed on the bottom of the dielectric substrate 111. The conductive ring 116 allows a second set of wire bonds 117 that wrap around the toroidal magnetic core 114 to form a secondary coil (S) having turns configured in parallel by electrically terminating the secondary winding traces 112 through the second set of wire bonds 117 on a second conductive ring 118 formed on the top surface of the dielectric substrate 111. The upper 118 and lower 116 conductive rings form the terminals for the secondary inductor coil. A principal benefit outlined here is that the toroidal magnetic core forms a closed magnetic path that reduces EMI to neighboring components to the power management circuit. Additional benefits include the ability to use a primary coil wound in series and a secondary coil having one or more segments wound in parallel to produce arbitrary turns ratios, including half-turn ratio, if desired. A final benefit is the ability to reduce proximity flux leakage and losses by maintaining equal spacing between windings of the primary and secondary coils, while the use of parallel windings in the secondary coils achieves a number of turns that is electrical different than the primary coil.

Limitations to the prior art are artifacts that limit its use to lower power and low power density applications. In high power density applications, the electromagnetic energy density is sufficient to induce electromechanical forces that will mechanically displace the wire bonds 115,117 at high power levels. This mechanical displacement will destroy the equal spacing between primary and secondary coil windings, which will induce proximity and flux leakage losses, and could lead to catastrophic failure at the bonding pads 119. Since high power density is a natural consequence of miniaturizing power management circuits it is therefore desirable to develop new methods that minimize flux leakage and proximity loss at these new thresholds. Further limitations to the prior art are the lack of insulating means surrounding the wire bonds 115,117 having high dielectric breakdown thresholds inserted between the primary and secondary coil windings to prevent corona discharges caused by the large voltage swings induced by the back emf formed in the transformer coil. Finally, discrete assembly manufacturing methods are costly because of the need to pre-fabricate the individual components and their assembly using a series of individual steps. Each manufacturing step has a statistical certainty of error.

Therefore, a larger number of manufacturing steps introduces higher likelihoods that the assembled device will fail. Furthermore, the manufacturer is also exposed to supply disruptions because he usually does not control the manufacture and supply of the discrete components. Therefore, it is desirable to introduce methods that improve manufacturing efficiency, permit circuit miniaturization by enabling means suitable for providing high power density solid state power management circuits.

Figure 4A:
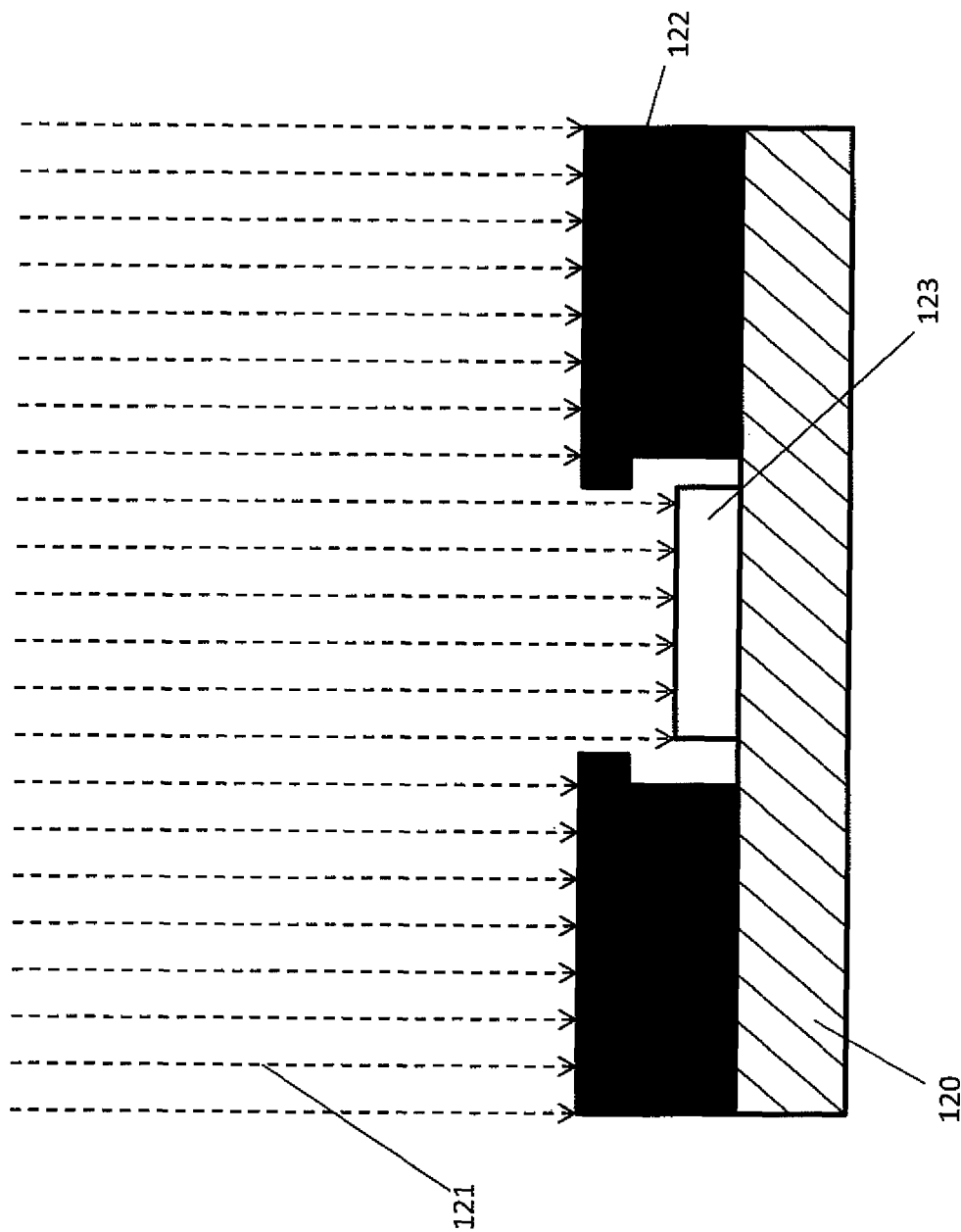
FIGS. 4A, 4B, 4C are side sectional drawings that illustrate how the LCD process is used to form monolithic structures on a substrate.
Figure 4B:
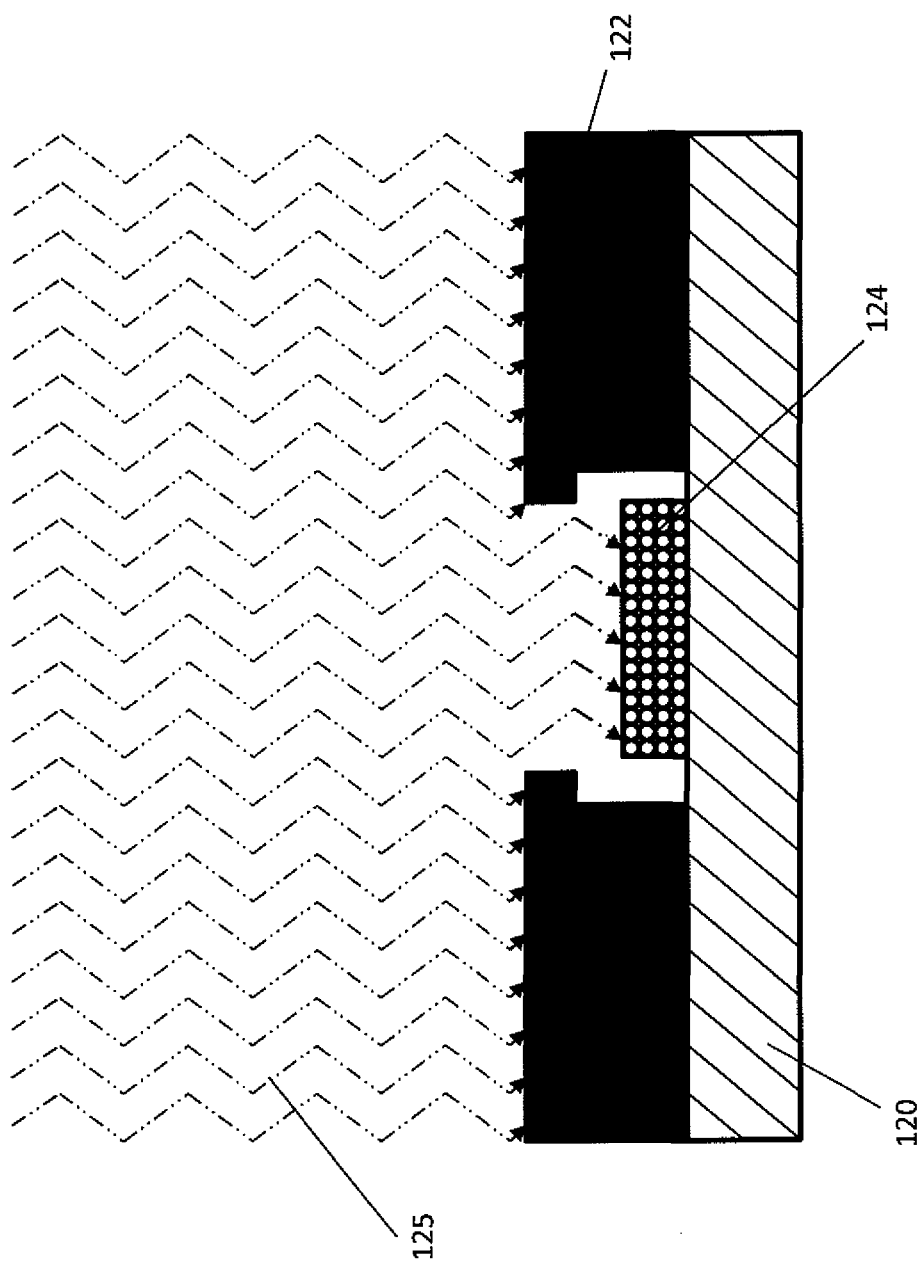
Figure 4C:
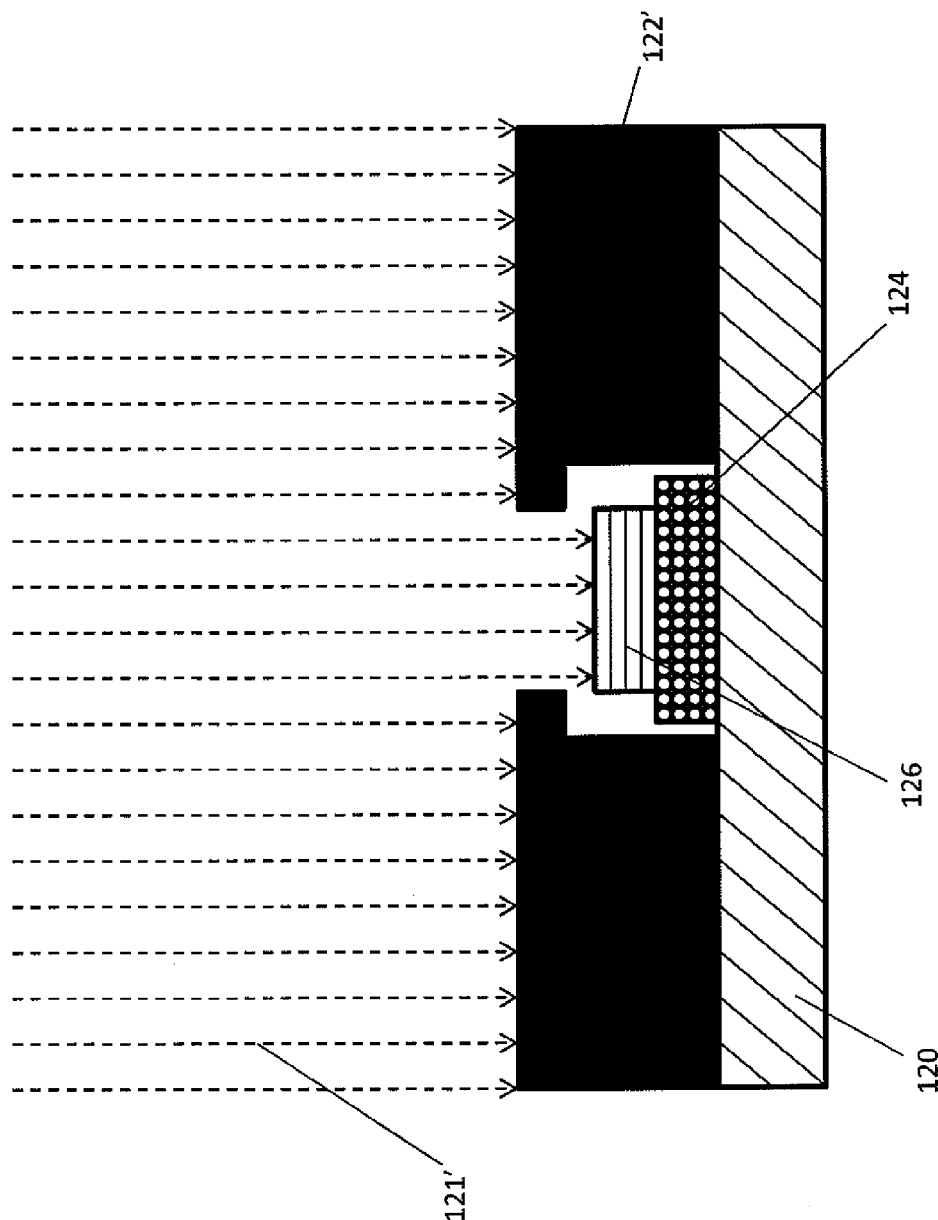

As shown in FIGS. 4A,4B,4C one LCD technique selectively deposits compositionally complex amorphous materials having precise composition and atomic-scale elemental uniformity on a metal, glass or semiconductor substrate 120 by spraying an aerosolized metalorganic precursor solution 121 through a mechanical mask 122 to form a chemically precise amorphous deposit 123. As discussed in detail in de Rochemont '159, de Rochemont '042, and de Rochemont and Kovacs '112, atomic-scale chemical uniformity is achieved by the simultaneous decomposition of the various metalorganic precursor species on the heated substrate surface. A deposit having uniform crystalline microstructure 124, wherein 100% of the grains have grain size less than 1.5× the mean grain size diameter, is formed by applying a subsequent rapid thermal annealing treatment 125, preferably a plasma annealing treatment, to the selectively located amorphous deposit 123. This technique is re-applied to selectively deposit additional "mismatched materials" 126 over pre-deposited materials 124 to form integrated monolithic structures by spraying an additional aerosolized metalorganic precursor solution 121' through a different mechanical mask 122'. Any material deposit may be formed as an amorphous or uniformly crystalline deposit, including a deposit with nanoscale microstructure, as desired for the specific functional purpose of that material deposit. Because the spray deposition temperatures are lower than 450° C., preferably lower than 400° C., and the rapid thermal annealing steps only heat the deposits, LCD permits the construction of monolithic structures on semiconductor substrates having active components buried beneath its surface. LCD deposits compositionally complex electroceramics when the deposited materials are processed in oxygenated atmospheres. Metals, alloys, superalloys, and semiconductors are integrated into the monolithic structure by processing the applied deposit in oxygen-free atmospheres.

An alternative LCD technique selectively deposits the material using hot-melt "ink jet" techniques that form a metalorganic wax precursor solid (with all liquid solvent is extracted) on the substrate, that is simultaneously decomposed using a rapid thermal annealing technique, preferably a plasma annealing technique.

Figure 5:
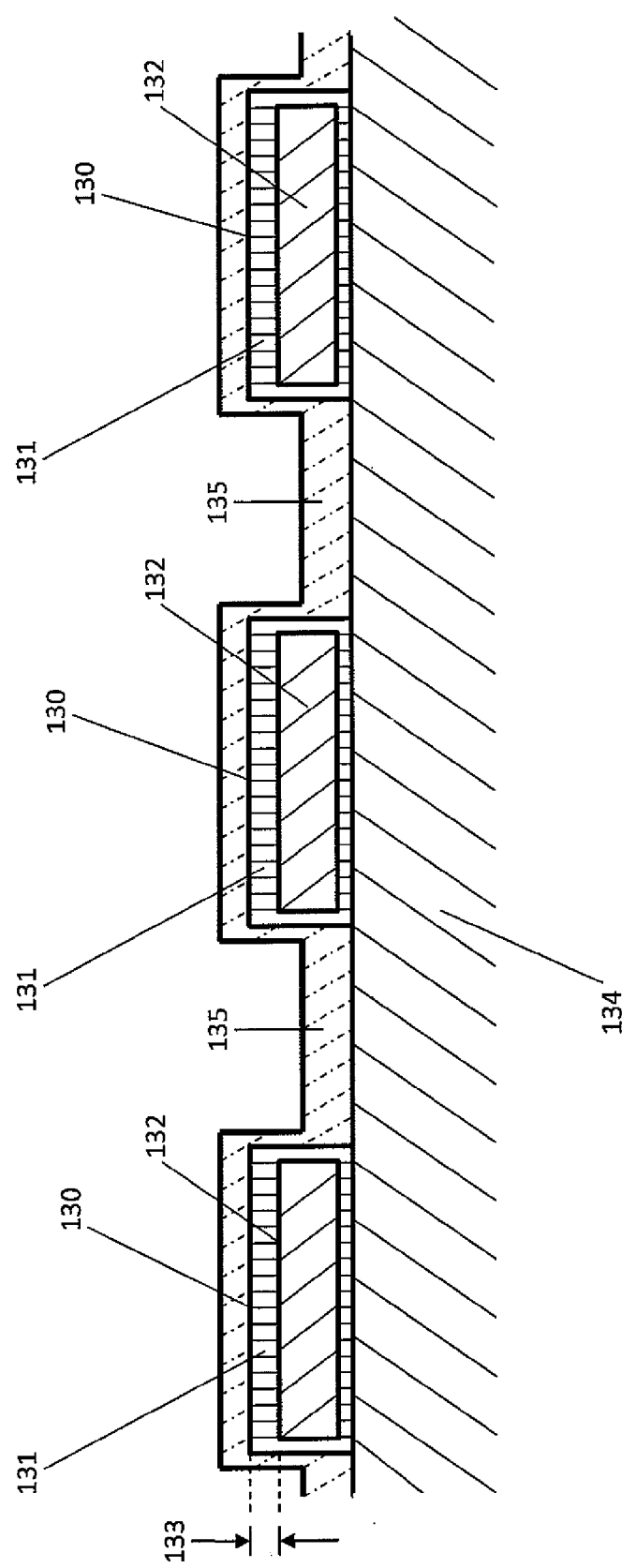
FIG. 5 is a sectional view of a mechanically reinforced inductor winding.

Reference is now made to FIGS. 5 thru 6 to illustrate specific embodiments that are improvements over the prior art necessary to permit the design and fabrication of fully integrated high power density power management circuits. In order to restrain the physical displacement of a transformer coil winding when strong electromechanical forces are exerted upon it by the high power densities contained within a low-loss, high permeability magnetic core, LCD methods are applied to form transformer windings 130 that are mechanically re-enforced as depicted in cross-section in FIG. 5. The mechanically re-enforced transformer windings 130 comprise thin layers of high electrical conductivity material 131, preferably but not necessarily copper conductor and might also comprise superconducting material, that envelop a hard mechanical constraining member 132. The mechanical constraining member 132 may consist of a hard, low-expansion elemental metal, such as tungsten or molybdenum, or it may comprise an alloy or superalloy, such as kovar, invar, or any other well-known low-expansion expansion material that has a measured hardness value that is at a minimum twice (2×) the measured hardness value of the high electrical conductivity material 131. The thickness 133 of the high conductivity layer 131 should range from 0.5× to 10× the ac skin depth at the device's optimal operating or switching frequency.

The coefficient of thermal expansion (CTE) is a critical parameter in the selection of the hard mechanical constraining member 132, and should match to within 25%, preferably within 10% of the coefficient of thermal expansion of the dielectric material(s) with which the high electrical conductivity material 131 is in physical contact. In designs where the high electrical conductivity material 131 is in contact with a plurality of adjacent dielectrics, such as the magnetic core 134 and an insulating dielectric 135 as depicted in FIG. 5, it is preferred that the CTE of the hard mechanical constraining member 132 mechanically match the adjacent material 134, 135 having the lower CTE.

An additional aspect of the present invention uses amorphous silica as the insulating dielectric 135 to prevent corona discharges (or dielectric breakdown if less strong insulators are used) between windings of the primary and secondary coils. Amorphous silica is the lowest loss (tan $\delta=2\times10^{-5}$) and most robust (threshold of dielectric breakdown of 10,000 KV-cm$^{-1}$) dielectric insulator ($\cong 10^{16}$ Ω-cm).

Figure 6A:
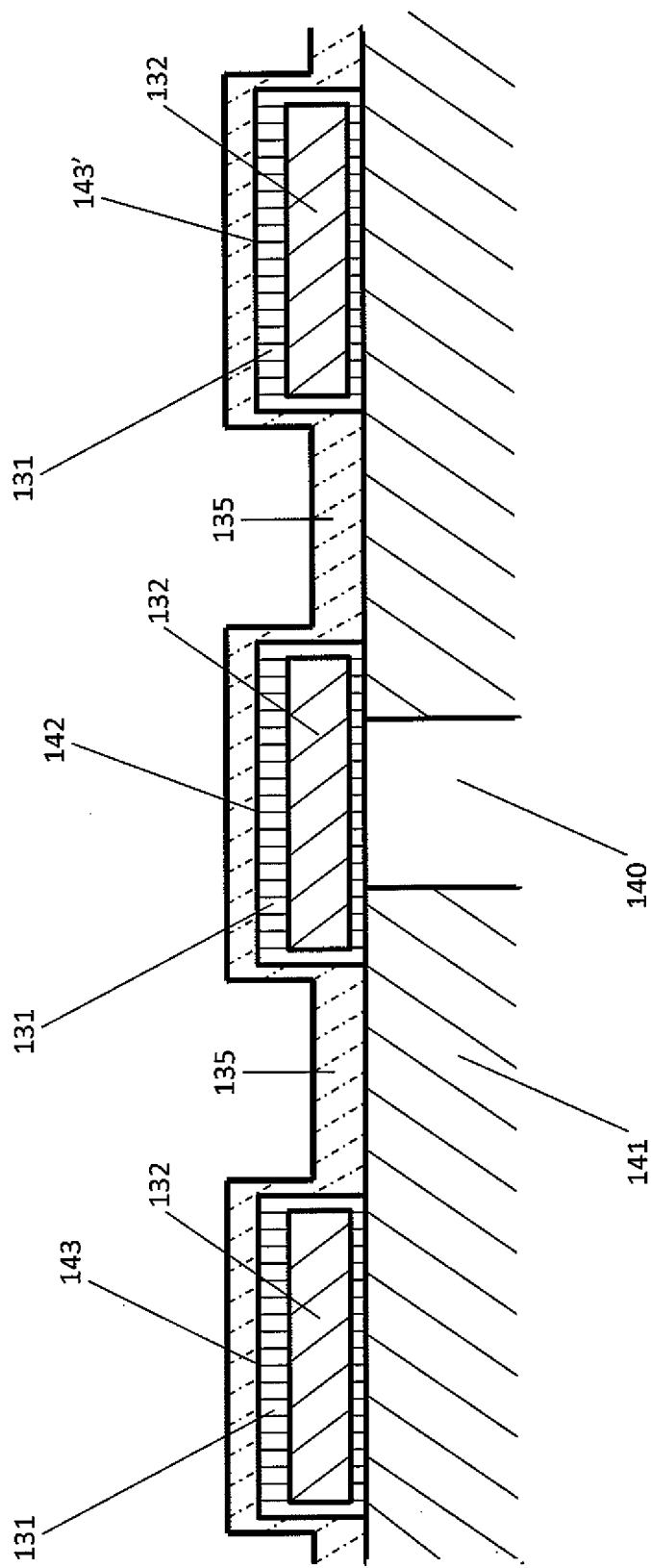
FIG. 6A is a sectional view of an inductor constructed in accordance with another embodiment of the present invention.
Figure 6B:
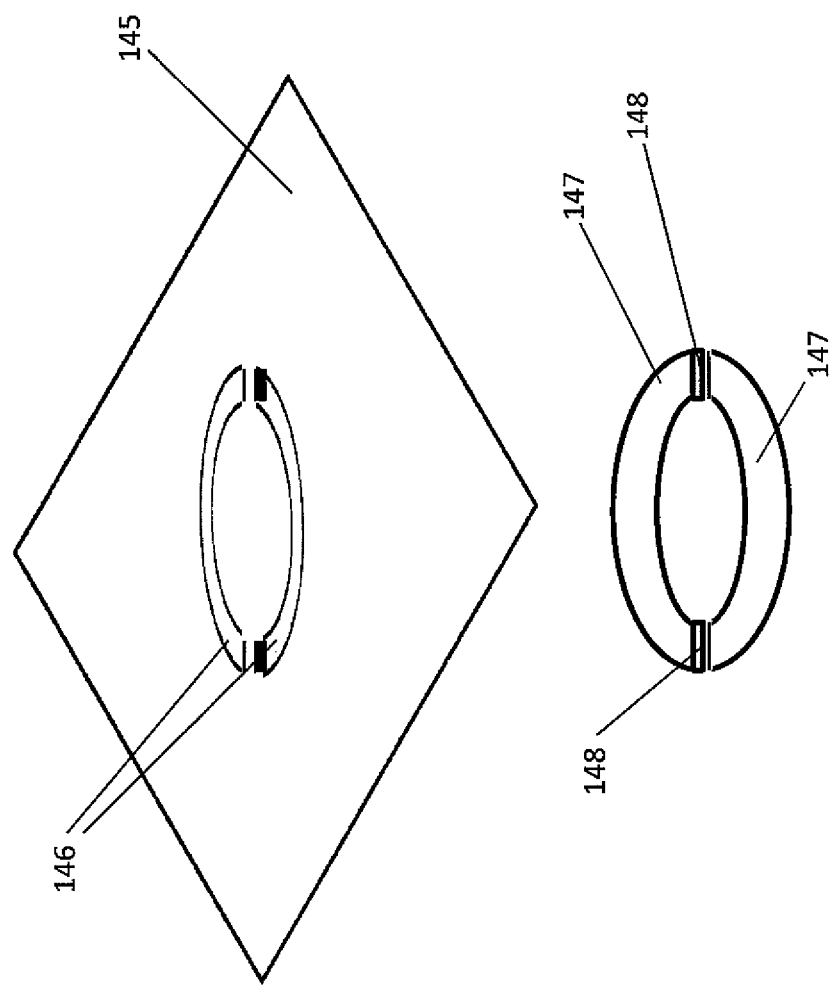
FIGS. 6B and 6C are perspective views of LCD masks used to form the inductor of FIG. 6A.
Figure 6C:
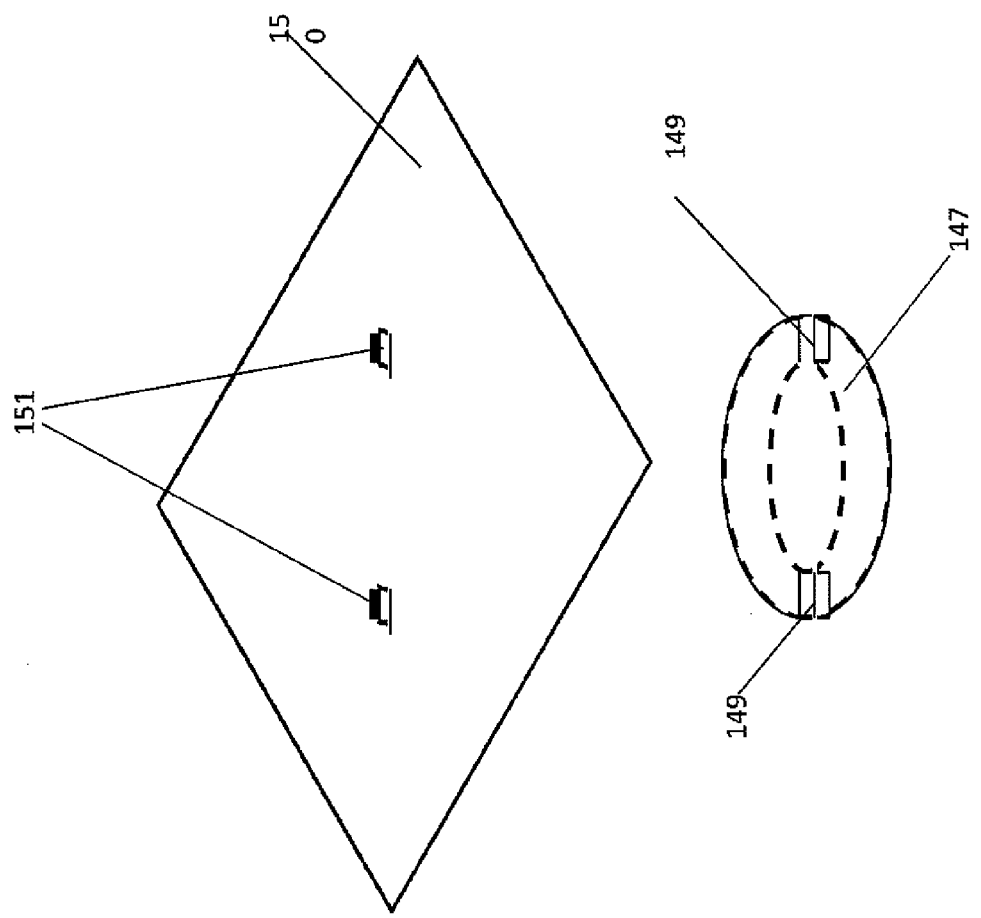

A further additional aspect of the present invention utilizes LCD methods to form to form a toroidal magnetic core with gaps in the magnetic material that are filled with an ultra-low loss material, preferably filled with amorphous silica. It is well-known to practitioners skilled in the art of transformer coil design that "air gaps" will concentrate magnetic energy. It is preferred to locate the "air gaps" 140 in regions of the magnetic core 141 that are adjacent to at least one secondary coil winding 142 to increase its power coupling efficiency with energy supplied by the primary coil windings 143,143' as shown in FIG. 6A. This is easily done with LCD by depositing high permeability core material utilizing a first mechanical mask 145 that has a perforation 146 that will deposit a toroidal magnetic core 147 with gaps 148 where desired as shown in FIG. 6B. The amorphous silica gap material 149 is then applied by spraying silicon metalorganic precursor solution through a complementary mask 150 that only has perforations 151 in the areas where the amorphous silica gap 149 is desired as shown in FIG. 6C.

In high power density applications, a specific purpose for which this invention was developed, the concentration of electromagnetic energy in the transformer is sufficiently powerful to mechanically deform and/or displace the inductor windings if they are not mechanically reinforced. Any such mechanical deformation or displacement will trigger flux jumping and proximity losses and could possibly cause catastrophic failure of the device. It is therefore a specific embodiment of the invention to produce a monolithic structure that has transformer coil windings that are mechanically reinforced by a hard mechanical constraining member 132 that is positioned within the windings' interior and/or by the formation of a mechanically hard insulating dielectric 135 such as amorphous silica. The mechanically reinforced transformer coil windings (shown in FIGS. 7-8D and 8F) are applied using similar techniques (both before and after the deposition of the toroidal magnetic core (with or without dielectric gaps) that are consistent with FIGS. 4A,4B, and 4C. A major improvement and economic distinction, in addition to numerous physical distinctions, over the prior art it that these techniques enable the efficient production of large numbers of individual circuits in parallel when applied to large surface area semiconductor wafers (300 mm to 450 mm, or more), which makes the wire bonding and discrete "pick and place" serial assembly techniques commercially non-competitive. Tight-tolerance photolithographic techniques are used to fabricate mechanical patterning masks 122,122',145,150. The subsequent selectively deposition to these tight tolerances when monolithically integrating various material by LCD methods enables the mass production of toroidal transformers to a very high structural precision that is not possible using discrete assembly methods described in the prior art. The precision placement of mechanically stable transformer coil windings is essential to minimizing proximity and flux leakage losses, and reducing catastrophic failure modes, These practical benefits represent a significant evolution of the prior art.

Figure 7:
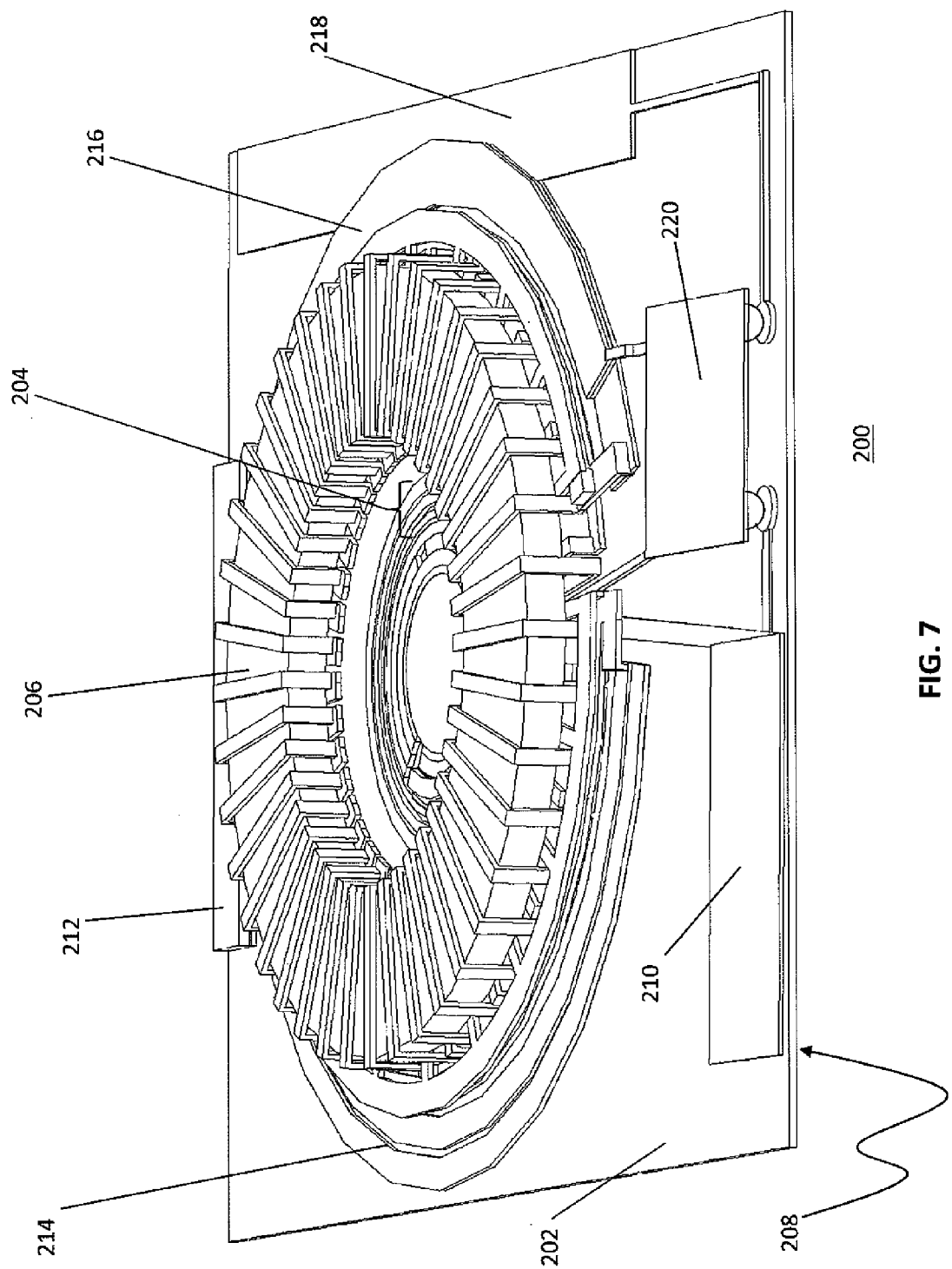
FIG. 7 shows a perspective view of a monolithic power management device formed on a semiconductor substrate in accordance with one embodiment of the present invention.

FIG. 7 depicts another embodiment of the present invention. LCD techniques are applied to monolithically integrate a mechanically reinforced toroidal transformer coil having arbitrary turns ratios and minimal proximity and flux leakage loss on the surface of a semiconductor so it maintains electrical communication with at least one embedded high gain surface MOSFET or MISFET power switch, herein after referred to as a surface FET, at least one embedded semiconductor diode, and other passive component structures (as needed) that have been selectively deposited on the semiconductor surface. While the semiconductor may comprise silicon, it may also preferably consist of any III-V compound semiconductor, such as gallium arsenide (GaAs), gallium nitride (GaN), or indium-gallium phosphide (InGaP).

Figure 8A:
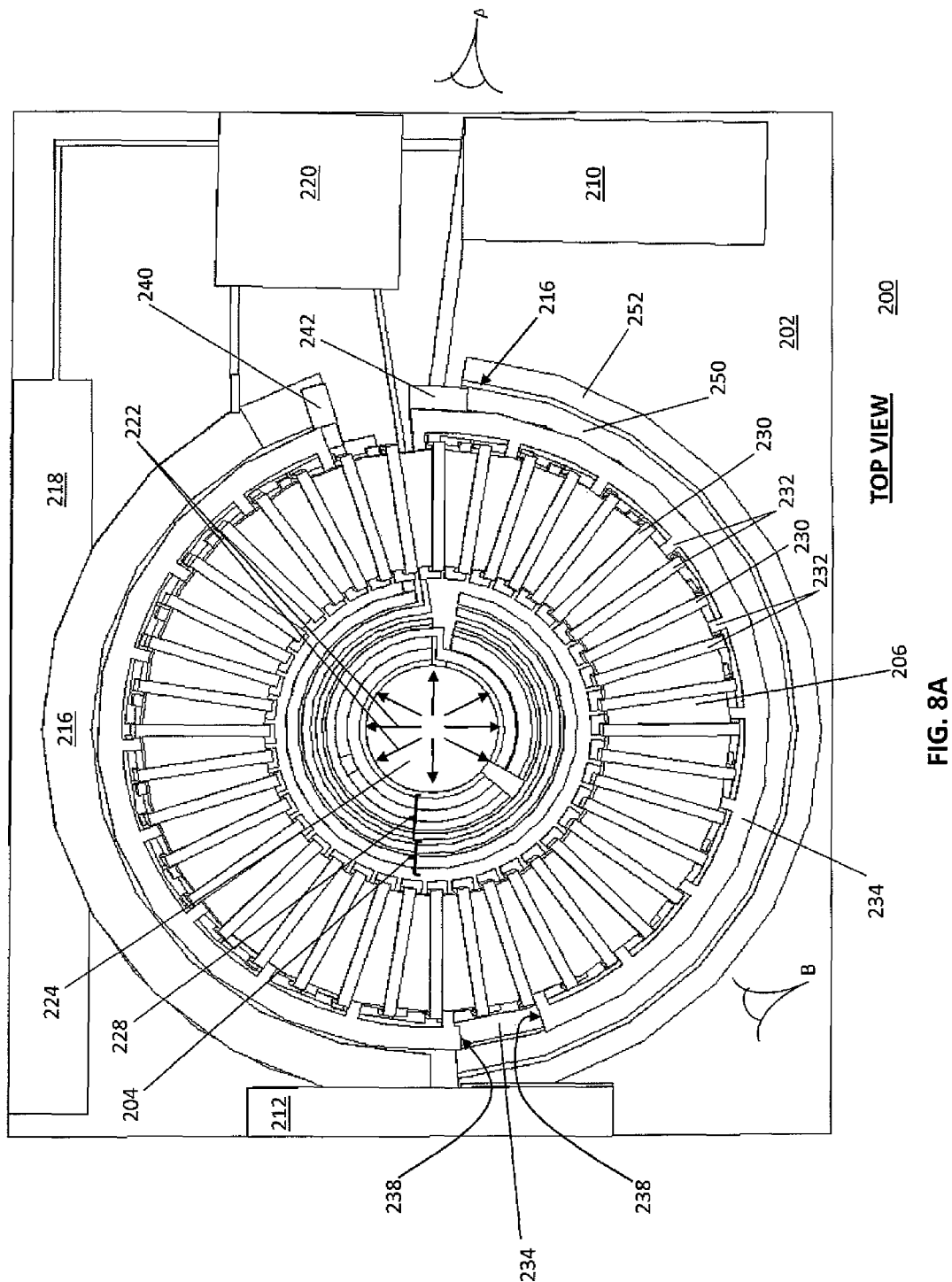
FIG. 8A shows a top view of the device of FIG. 7.
Figure 8B:
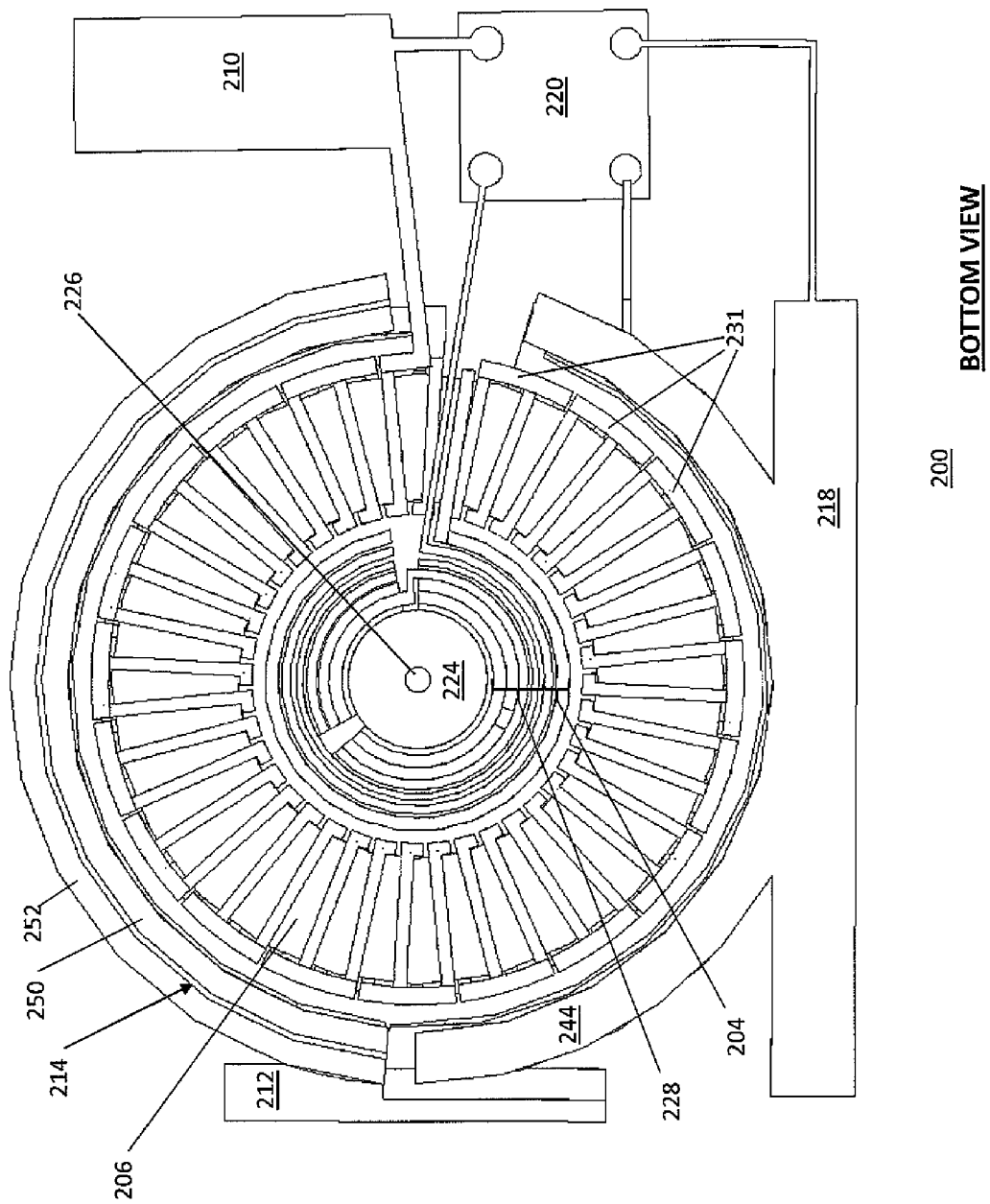
FIG. 8B shows a bottom view of the device of FIG. 7.
Figure 8D:
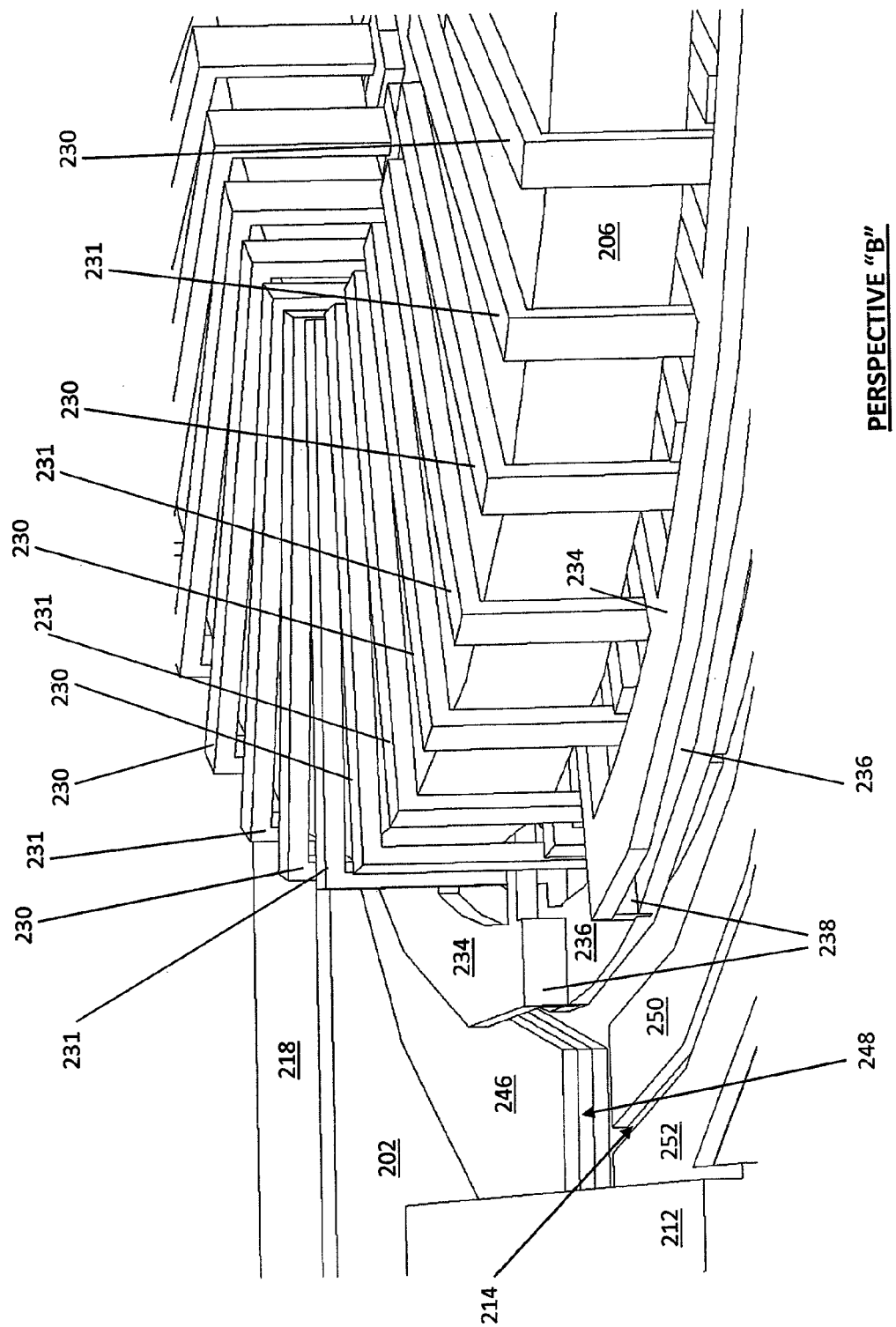

All insulating dielectric material 135 (FIGS. 5 and 6A) used to electrically isolate windings and traces, or as physical layers in the monolithic construction, have been removed in FIG. 7 and FIGS. 8A,B,C,D,F for the purpose of graphical clarity. FIG. 7 overviews a monolithic DC-DC power management circuit 200 modulated by a surface FET 204 integrated onto a semiconductor die 202 that functions as the fly-back power management system 1 (FIG. 1). A surface FET 204 is embedded in the semiconductor die 202 functions as the power switch 5 (FIG. 1). The surface FET 204 is positioned within the empty interior space of toroidal transformer 206 that is formed on the semiconductor die 202 using the LCD methods described above. The surface FET 204 modulates current from the DC power source 3 (FIG. 1) to the primary coil 9 (FIG. 1) of the toroidal transformer 206. Current from the DC power source 3 (FIG. 1) is supplied to the monolithic circuit through a backside ground contact 208. An input pad 210 on the top surface of the semiconductor die 202 is used to complete the electrical connection between the transformer's primary coil 9 (FIG. 1) within the toroidal transformer 206 and the DC power source 3 (FIG. 1). An output pad 212 on the top surface of the semiconductor die 202 supplies conditioned DC output power 16 that has been regulated by the monolithic DC-DC power management circuit modulated by a surface FET 204. In a fly-back power management system 1 (FIG. 1), the output pad 212 makes parallel electrical communication to the output of the transformer's secondary coil 11 (FIG. 1) through a diode 15 (FIG. 1), and with a capacitor 17 (FIG. 1) that is jointly connected to ground and the input the input of the transformer's secondary coil 11 (FIG. 1). In the monolithic DC-DC circuit, an embedded diode 214 is circumferentially configured over part of the semiconductor surface area exterior to the toroidal transformer 206. One contact (discussed below in greater detail) of the embedded diode 214 is in electrical communication with the output from secondary coil 11 (FIG. 1) of the toroidal transformer 206, while the other is in electrical communication with the output pad 212. On the opposite side of the toroidal transformer, a the bottom contact (discussed below in greater detail) of a parallel plate capacitor 216 makes simultaneous electrical communication with a ground pad 218 located on the top surface of the semiconductor die 202 and the input of the secondary coil 11 (FIG. 1) of the toroidal transformer 206. The control circuitry 19 (FIG. 1) may be configured as a surface-mounted controller chip 220 as shown in FIG. 7 (FIG. 1), or it may alternatively be embedded in the semiconductor die (not shown) if its semiconductor material is compatible with those functions and it is economically advantageous to do so.

A fundamental limitation to discretely assembled power management systems is that the manufacturers of the individual components are economically incentivized in ways that constrain the fully assembled system. For instance, manufacturers of discrete power FETs are economically incentivized to make their devices smaller. The smaller devices are prone to thermal runaway as a given current will induce higher current densities when crammed into the smaller discrete FET volume. This requires the system manufacturer to compensate with improved thermal management systems to drain the higher levels of heat produced by the higher current densities.

FIGS. 8A,B,C,D,E,F are now referenced to illustrate specific attributes of the monolithic DC-DC power management circuit modulated by a surface FET 204 that relieve these constraints in greater detail. FIG. 8A shows a top view of the monolithic fly-back circuit. A surface FET 204 is adjacent the interior circumference of the transformer toroid 206. The surface 204 FET may comprise a plurality of individual surface FETs (not shown) configured in series and/or in parallel as is optimal for a given design specification. The purpose of the circumferential geometry is to distribute large input currents 222 drawn from the backside ground contact 208 (FIG. 7) over a larger surface area so that the current density in any segment of the surface FET 204 is minimized, thereby reducing undesirable heat generation. The large input currents 222 are supplied to a center contact pad 224 on the top surface of the semiconductor die 202 through via 226 (FIG. 8B) that is in electrical communication with the backside ground contact 208. (Note: semiconductor die 202 is not shown in FIG. 8B for clarity purposes). As may be needed by a given circuit design, the large currents 222 may be conditioned by an optional additional circuitry 228 inserted between the center contact pad 224 and the surface FET 204. As discussed in greater detail below, the optional additional circuitry 228 may consist of one or more active components (diodes and transistors) embedded in the semiconductor die 202 and/or one or passive resistors or capacitors that have been selectively deposited on the surface of the semiconductor die 202 using LCD methods.

A particular aspect of the monolithic DC-DC power management circuit modulated by a surface FET 200 includes the integration of a toroidal transformer 206 with interleaved mechanically reinforced coil windings wherein two or more segments of either the primary or the secondary coil are wound in parallel. Two or more parallel winding segments permit the construction of a transformer having arbitrary turn-ratios, as well as low proximity and flux leakage losses made possible by the consistent spacing between windings of the primary and secondary coils. Two or more parallel winding segments are inserted into the primary coil when a step-up transformer is desired. Conversely, two or more parallel winding segments are inserted into the secondary coil when a step-down transformer is desired.

FIGS. 7 and 8A,8B,8C,8D depict a 10:1 step-down transformer wherein the primary coil windings 230 are configured as 20 turns wound in series. The series connections between the windings of the primary coil are made by depositing primary electrodes 231 directly on the surface of the semiconductor die. The secondary coil windings 232 are configured as two 10-turn winding segments, with each winding segment having 10 turns wound in parallel. The parallel turns are achieved by terminating the individual winding on upper 234 and lower 236 (FIGS. 8C,8D) outer ring conductors that are electrically insulated from one another by an insulating dielectric material 135 (not shown), preferably an amorphous silica insulating dielectric. Parallel winding terminations 238 that electrically contact the upper ring conductor 234 to the lower ring conductor 236 are located at the secondary coil input 240 and output 242 and the beginning or ending of a parallel-turn segment as shown in FIG. 8A. In this configuration, the two parallel turn segments are connected in series by electrical connection through the lower ring conductor 236. The secondary coil input 240 is in electrical communication with the bottom electrode 244 of the parallel plate capacitor 216 and the ground pad 218. (FIG. 8C) The top electrode 246 of the parallel plate capacitor 216 is in electrical communication with the output pad 212.

The combination of very large surface areas, enabled by a parallel plate capacitor 216 that partially envelopes an exterior side of the transformer coil 206, with the high electrical density (high-K or high permittivity) dielectric materials 248 enabled by LCD processing ($\in_R$>50, preferably 50≤$\in_R$≤400) that can be inserted in the parallel plate capacitor 216 with small layer thickness (0.5 µm to 10 µm) allows output capacitors having milli-farad densities to integrated onto the semiconductor die 202 to serve very high power applications. LCD also allows multilayer capacitors (not shown) to be integrated into the power management system to boost output capacitor values further, if needed.

Figure 8E:
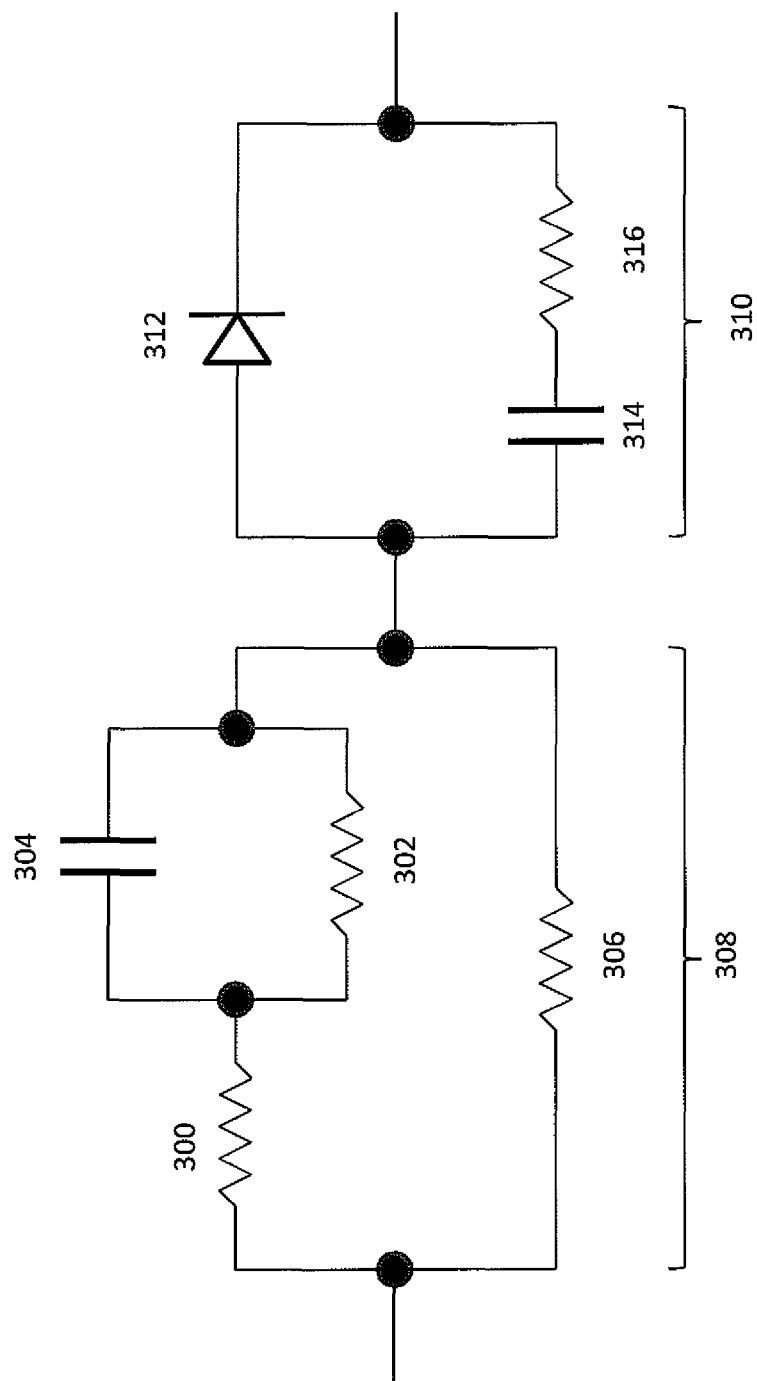
FIG. 8E is a circuit diagram of a portion of the device of FIG. 7.
Figure 8F:
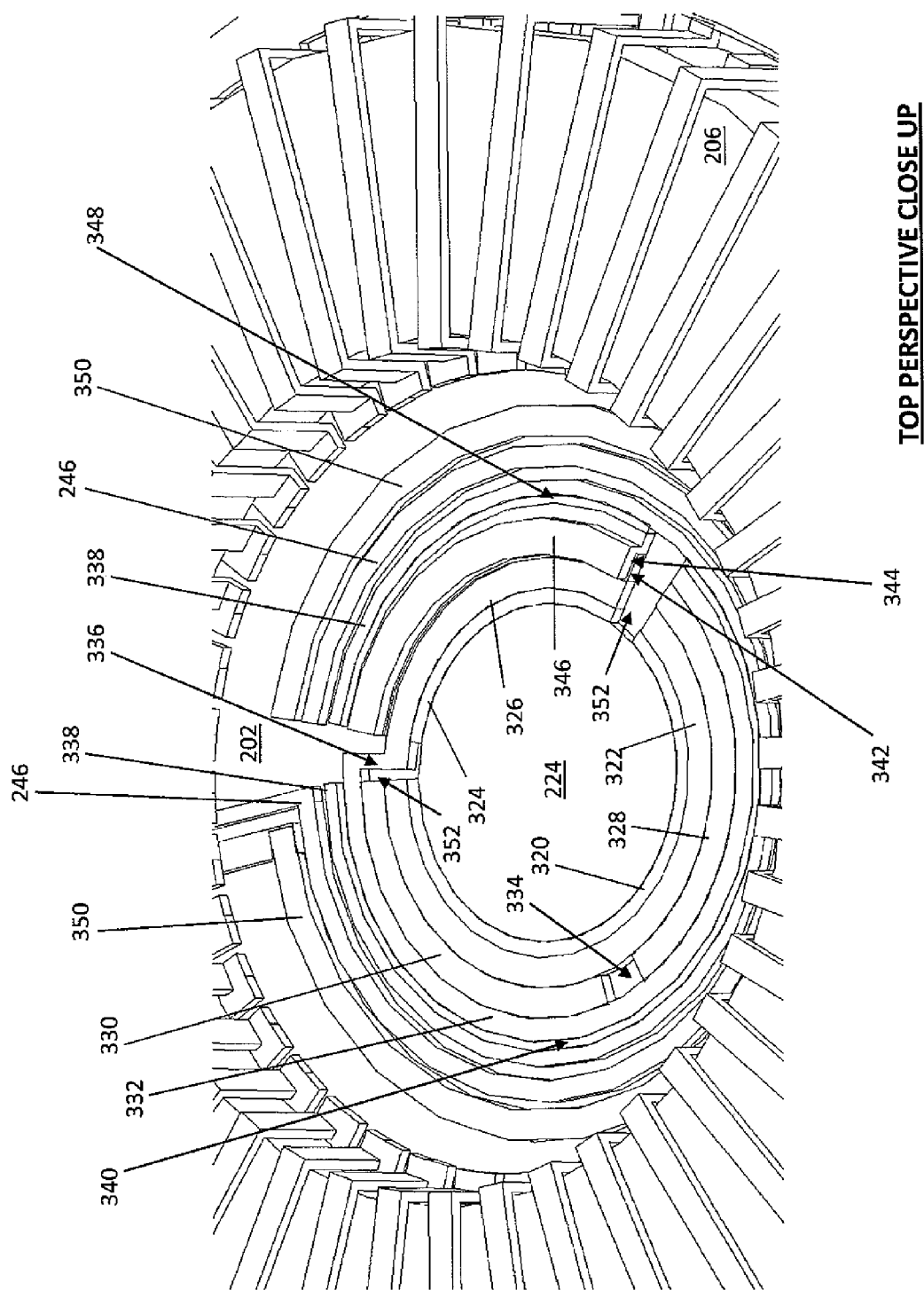

The secondary coil output 242 is also in electrical communication with an inner ring electrode 250 that serves as the input to embedded diode 214. Outer ring electrode 252 is in electrical communication with output pad 212 and the output of embedded diode 214. The wide area over which the embedded diode 214 is distributed by constructing it with circumferential geometry enables large output currents to be managed with low current densities in the diode to reduce thermal management issues. However, should thermal management become an issue, the very large surface area to volume ratio of the monolithic DC-DC power management device facilitates heat transfer to a thermal sink that could placed in intimate contact with the backside ground contact 208 (FIG. 7) to facilitate the application of the invention to high-power air-cooled systems. Control chip 220 inputs are established by electrical communication to the signal output by first trace 254 to the top electrode 246 of the parallel plate capacitor 216, which is electrical communication to the output pad 212, a second trace 256 to the ground pad 218 (or to the bottom electrode 244 of the parallel plate capacitor since it is in electrical communication with the output pad 212), and a third trace 258 to the input pad 210. The use of a ground shielded trace 260 to the gate electrode 246 which modulates the surface power FET 204 is preferred since it must run beneath the toroidal transformer 206. A last aspect of the invention relates to the optional additional circuitry 228 inserted between the center contact pad 224 and the surface FET 204. Certain designs may call for additional passive or active components to be inserted between the power switch 5 and ground to effectuate proper operation of the controller chip 220. Without making reference to any particular design, a circuit diagram of passive and active components configured in series and in parallel is provided in FIG. 8E to illustrate how such additional circuitry might be configured in monolithic DC-DC power management circuit modulated by a surface FET 200 as shown in FIG. 8F. For the purpose of demonstration it is assumed the additional circuitry 228 consists of a first resistor 300 in series with a second resistor 302 and a first capacitor 304 in parallel with one another. These passive components 300,302,304 are in configured in parallel with a third resistor 306 to form a first stage 308 of the additional circuitry 228. A second stage 310 configured in series with the first stage 308 consists of an active embedded diode 312 in parallel with a second capacitor 314 in series with a fourth resistor 316.

LCD methods are used to construct additional circuitry 228 by selectively depositing metal having patterns wherein partial arc lengths at fixed radial distances from the center of the center contact 224 form the electrodes of a passive or active component, and selectively depositing dielectric materials in patterns forming partial arc lengths at other fixed radial distances from the center of the center contact 224 are used to fully form the passive components. Using these techniques and referring to FIG. 8F, the circuit diagram in FIG. 8E is replicated on the semiconductor die 202 (FIG. 7) by selectively depositing a first resistive material 320 that makes electrical contact with the center contact 224 over an arc length that partially envelopes the circumference of center contact 224 to form first resistor 300 when placed in electrical contact with a first partial arc electrode 322 selectively deposited at the outer circumference of first resistive material 320. A second resistive material 324 is selectively deposited over another distinct arc length that partially envelopes the circumference of center contact 224 so as not be in direct electrical contact with the first resistive material 320 except through center contact 224. The second resistive material 324 forms third resistor 306 when placed in electrical contact with a second partial arc electrode 326. A first capacitive dielectric material 328 is selectively deposited over an arc length that envelopes a portion of the outer circumference of the first partial arc electrode 322. A third resistive material 330 is selectively deposited over an arc length that envelopes a remaining portion of the outer circumference of the first partial arc electrode 322 so as not be in electrical communication with the first capacitive dielectric material 328 except through the first partial arc electrode 322. The third resistive material 330 and the first capacitive material form second resistor 302 and first capacitor 304 connected in parallel when a third partial arc electrode 332 is selectively deposited over an arc length that envelopes the outer circumferences of both the first capacitive material 328 and the third resistive material 330 and any insulating region 334 that may be situated between first capacitive material 328 and third resistive material 330. The first stage 308 is completed by selectively depositing an interconnecting partial arc electrode 336 that places second partial arc electrode 326 in electrical communication with third partial arc electrode 332.

The second stage 310 is configured by selectively depositing an outer ring electrode 338 that encompasses all the circumferential area in which additional circuitry 228 is deposited between center contact 224 and the outer ring electrode 338. The outer ring electrode 338 also serves as the source/(drain) electrode (depending upon the polarity desired) for the surface FET 204. The active embedded diode 312 is formed by properly doping the semiconductor die 202 in the gap 340 located between outer ring electrode 338 and the third partial electrode 332. An alternative vertical parallel plate structure is demonstrated to form a capacitive element by selectively depositing a bottom partial arc electrode 342 that extends electrical communication outwards in the radial direction from second partial arc electrode 326. A second capacitive dielectric material 344 is selectively deposited over the bottom partial arc electrode 342. Second capacitor 313 is completed by depositing a top partial arc electrode 346 over the second capacitive dielectric material 344 in a manner that it does not make electrical contact with the bottom partial arc electrode 342 except through the second capacitive dielectric material 344. The second stage 310 is completed by selectively depositing a fourth resistive material 348 between the bottom partial arc electrode 342 and the outer ring electrode. The gate electrode 246 modulates current flow from (to) the center contact 224 through the additional circuitry 228 to the drain/(source) electrode (depending upon circuit polarity) 350 that is in electrical communication with the input/(output) of the primary coil 352 of the toroidal transformer 206. As previously noted above, insulating dielectric 135 (not shown), preferably amorphous silica dielectric is applied to any gap areas 354 to electrically isolate the individual components forming the additional circuitry 228.

While additional circuitry 228 configured in partial arc length geometry is preferred because it allows current flows to be uniformly distributed over larger surface areas, it is also held that components of the additional circuitry 228 need not take that geometric form and can also be applied using similar methods to regions on the surface of the semiconductor die 202 that are exterior to the transformer coil 206 as may be needed to serve a particular design objective.

The present invention is illustratively described above in reference to the disclosed embodiments. Various modifications and changes may be made to the disclosed embodiments by persons skilled in the art without departing from the scope of the present invention as defined in the appended claims.

What is claimed is:

1. A monolithic DC to DC converter, comprising:
a semiconductor substrate;
a surface FET formed on the semiconductor substrate that modulates currents across a surface of the semiconductor substrate; and
a toroidal inductor with a magnetic core formed on the substrate around the FET and having a first winding connected to the FET.

2. The converter of claim 1, wherein the first winding is a primary inductor coil and further comprising a secondary inductor coil formed on the substrate and having windings interleaved between windings of the primary inductor coil.

3. The converter of claim 1, wherein the FET includes a circular or arcuate source electrode and an arcuate gate electrode formed peripherally around the source electrode.

4. The converter of claim 3, further comprising a via connecting the source electrode through the substrate to a ground plane.

5. The converter of claim 3, wherein the FET includes an arcuate drain electrode formed peripherally to the source and gate electrodes.

6. The converter of claim 3, wherein the FET includes a plurality of arcuate drain electrodes formed peripherally at different angular positions around the source and gate electrodes.

7. The converter of claim 3, wherein the FET includes passive components formed on the semiconductor substrate within the toroidal inductor and connected to the source, gate or drain electrodes.

8. The converter of claim 1, further comprising an arcuate plate capacitor formed peripherally to the toroidal inductor.

9. The converter of claim 1 further comprising an arcuate diode formed peripherally to the toroidal inductor.

10. The converter of claim 1, wherein the magnetic core is ceramic and formed on the substrate with at least one layer of amorphous silica located between opposing sections of high permeability crystalline core material.

11. The converter of claim 10, wherein the toroidal inductor includes a secondary winding having a turn aligned with the at least one layer of amorphous silica.

12. The converter of claim 1, wherein toroidal inductor includes windings that are mechanically constrained.

13. The converter of claim 12, wherein mechanical constraint of the windings is achieved by a coating of amorphous silica.

14. A monolithic DC to DC converter as in claim 1 having a semiconductor substrate containing silicon.

15. A monolithic DC to DC converter as in claim 1 having III-V compound semiconductor substrate.

16. A magnetic core, comprising a ceramic core element formed with at least one layer of amorphous silica located between opposing sections of high permeability crystalline core material, wherein the ceramic element (or core material) has a resistivity $>10^4$ ohm-cm and a permeability $\geq 70$.

17. The magnetic core of claim 16, wherein the ceramic core element is formed with a plurality of amorphous silica layers, each located between opposing sections of crystalline core material.

18. The magnetic core of claim 16, further comprising an electrical conductor winding aligned with the at least one layer of amorphous silica.

19. An inductor, comprising: a magnetic core formed with a dielectric gap of high-resistivity material located between opposing sections of crystalline core material and an electrical conductor aligned with the dielectric gap.

20. The inductor of claim 19, wherein the electrical conductor is a secondary winding of a transformer.

* * * * *